(12) United States Patent
Hsia

(10) Patent No.: US 10,546,791 B2
(45) Date of Patent: Jan. 28, 2020

(54) METHOD AND SYSTEM OF SURFACE POLISHING

(71) Applicant: Kangmin Hsia, McKinney, TX (US)

(72) Inventor: Kangmin Hsia, McKinney, TX (US)

( * ) Notice: Subject to any disclaimer, the term of this patent is extended or adjusted under 35 U.S.C. 154(b) by 413 days.

(21) Appl. No.: 15/449,377

(22) Filed: Mar. 3, 2017

(65) Prior Publication Data

US 2017/0229357 A1 Aug. 10, 2017

Related U.S. Application Data

(62) Division of application No. 14/095,937, filed on Dec. 3, 2013, now Pat. No. 9,586,279.

(Continued)

(51) Int. Cl.
| | | |
|---|---|---|
| *B23H 1/02* | (2006.01) | |
| *H01L 21/66* | (2006.01) | |
| *B23H 9/02* | (2006.01) | |
| *B23H 1/08* | (2006.01) | |
| *B23H 7/28* | (2006.01) | |

(Continued)

(52) U.S. Cl.
CPC .............. *H01L 22/20* (2013.01); *B23H 1/02* (2013.01); *B23H 1/028* (2013.01); *B23H 1/04* (2013.01); *B23H 1/08* (2013.01); *B23H 3/00* (2013.01); *B23H 7/28* (2013.01); *B23H 7/32* (2013.01); *B23H 9/00* (2013.01); *B23H 9/02* (2013.01); *B24B 19/22* (2013.01); *H01L 21/306* (2013.01); *H01L 21/31053* (2013.01);
(Continued)

(58) Field of Classification Search
CPC . B23H 1/02; B23H 1/028; B23H 1/04; B23H 1/08; B23H 3/00; B23H 7/28; B23H 7/32; B23H 9/00; B23H 9/02; H01L 22/20; H01L 21/306; H01L 21/31053; H01L 21/3212; H01L 22/12; H01L 21/3065; H01L 21/32115
USPC ................................................. 219/69.14
See application file for complete search history.

(56) References Cited

U.S. PATENT DOCUMENTS

| | | | | | |
|---|---|---|---|---|---|
| 2,979,639 | A | * | 4/1961 | Porterfield | ............ B23H 1/022 |
| | | | | | 219/69.18 |
| 4,564,912 | A | * | 1/1986 | Schwefel | ........... G05B 19/4163 |
| | | | | | 219/69.16 |

(Continued)

FOREIGN PATENT DOCUMENTS

| | | | | |
|---|---|---|---|---|
| JP | 05277832 | A | * | 10/1993 |
| JP | 2000343334 | A | * | 12/2000 |
| JP | 2004142038 | A | * | 5/2004 |

*Primary Examiner* — Brian W Jennison
(74) *Attorney, Agent, or Firm* — Morgan, Lewis & Bockius LLP

(57) ABSTRACT

A method of polishing a surface of an object disposed within a gas chamber is provided. The method includes filling the gas chamber with a discharging medium to a predefined pressure, applying a voltage between an electrode and the surface, calibrating a height of the electrode relative to the surface so as to establish electrical breakdown threshold criteria, and scanning the electrode with respect to the surface so as to sequentially position the electrode over a plurality of locations on the surface, each location characterized by a surface error. When a respective location in the plurality of locations has a surface error that meets the electrical breakdown threshold criteria, electrical breakdown occurs, whereby the electrical breakdown results in a discharging pulse that polishes the surface.

12 Claims, 24 Drawing Sheets

Related U.S. Application Data

(60) Provisional application No. 61/879,080, filed on Sep. 17, 2013.

(51) Int. Cl.
  *B23H 9/00*      (2006.01)
  *H01L 21/3105*   (2006.01)
  *B23H 3/00*      (2006.01)
  *B23H 7/32*      (2006.01)
  *B24B 19/22*     (2006.01)
  *H01L 21/306*    (2006.01)
  *B23H 1/04*      (2006.01)
  *H01L 21/321*    (2006.01)
  *H01L 21/3065*   (2006.01)

(52) U.S. Cl.
  CPC .......... *H01L 21/3212* (2013.01); *H01L 22/12* (2013.01); *H01L 21/3065* (2013.01); *H01L 21/32115* (2013.01)

(56) References Cited

U.S. PATENT DOCUMENTS

| | | | |
|---|---|---|---|
| 5,122,921 A * | 6/1992 | Koss ...................... | H02H 9/005 361/111 |
| 2002/0079292 A1* | 6/2002 | Wehrli .................... | B23H 7/02 219/69.11 |
| 2007/0205184 A1* | 9/2007 | Mazumder ............... | B23H 9/00 219/69.17 |
| 2011/0174634 A1* | 7/2011 | Cabrera ................... | B23H 3/04 205/645 |

\* cited by examiner

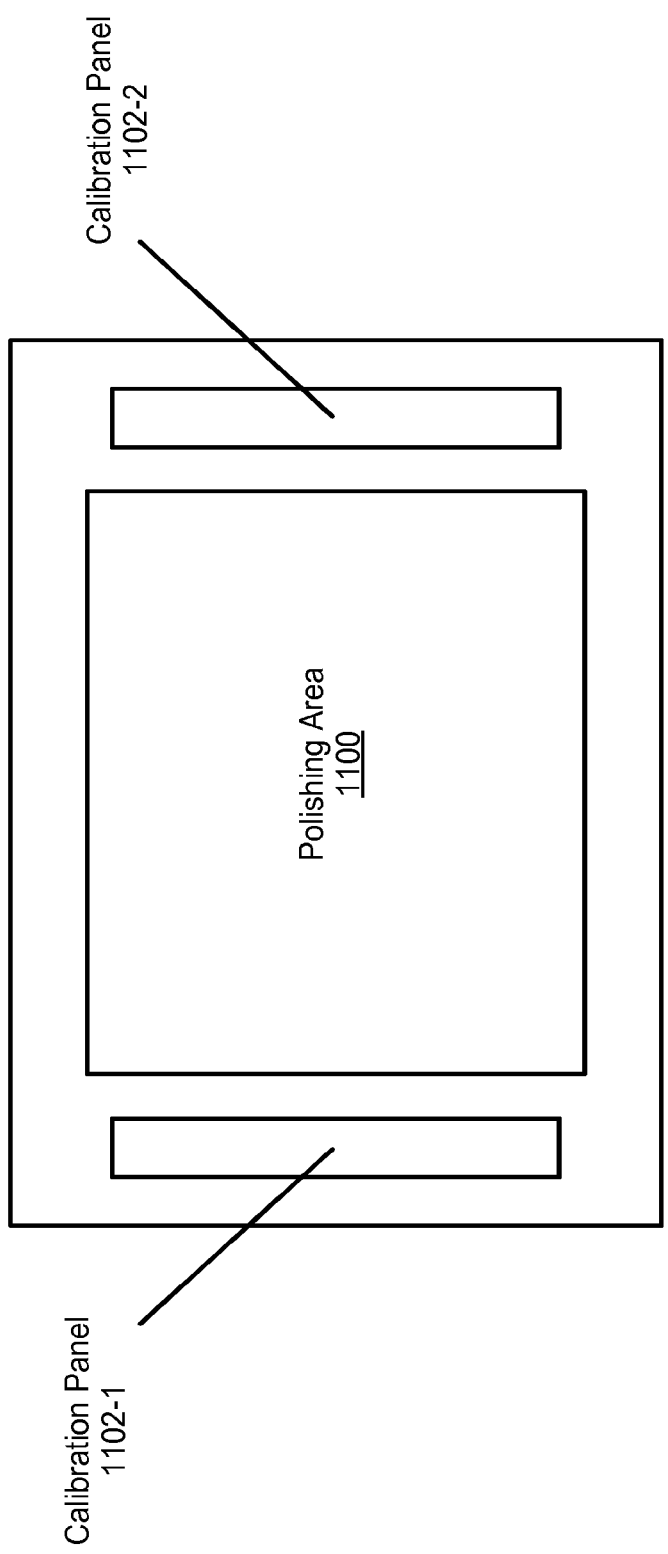

1500

```
┌─────────────────────────────────────────────────────────────────┐
│ Generate a pixel map of a surface. The pixel map includes a     │─1502
│ plurality of pixels including a first pixel and a second pixel. │
│ The first pixel corresponds to a first surface error associated │
│ with a first location on the surface and the second pixel       │
│ corresponds to a second surface error associated with a         │
│ second location on the surface.                                 │
│  ┌─────────────────────────────────────────────────────────┐    │
│  │ The pixel map is generated in real-time using a surface │────│─1504
│  │ height measurement sensor                               │    │
│  └─────────────────────────────────────────────────────────┘    │
│  ┌─────────────────────────────────────────────────────────┐    │
│  │ The pixel map is generated using a metrology tool prior │    │
│  │ to the filling, positioning, and determining operations │────│─1506
│  │ below (cf. operations 1508, 1510, and 1516)             │    │
│  └─────────────────────────────────────────────────────────┘    │
└─────────────────────────────────────────────────────────────────┘
                                 ▼
┌─────────────────────────────────────────────────────────────────┐
│ Fill the gas chamber with a discharging medium to a predefined  │─1508
│ pressure                                                        │
└─────────────────────────────────────────────────────────────────┘
                                 ▼
┌─────────────────────────────────────────────────────────────────┐
│ Position an electrode with respect to the surface such that     │─1510
│ the electrode is proximal to the first location                 │
│  ┌─────────────────────────────────────────────────────────┐    │
│  │ The electrode is a respective electrode in an electrode │────│─1512
│  │ array. The electrode array includes a plurality of      │    │
│  │ electrodes.                                             │    │
│  └─────────────────────────────────────────────────────────┘    │
│  ┌─────────────────────────────────────────────────────────┐    │
│  │ The electrode is a needle-type electrode having a tip.  │    │
│  │ The tip has a distal end disposed proximal to the       │────│─1514
│  │ surface and characterized by a radius of curvature at   │    │
│  │ the distal end within a first predefined range, and an  │    │
│  │ included angle within a second predefined range.        │    │
│  └─────────────────────────────────────────────────────────┘    │
└─────────────────────────────────────────────────────────────────┘
                                 ▼
┌─────────────────────────────────────────────────────────────────┐
│ Determine if the first surface error meets predefined polishing │─1516
│ criteria                                                        │
└─────────────────────────────────────────────────────────────────┘
                                 ▼
                                (A)
```

FIG. 15-1

METHOD AND SYSTEM OF SURFACE POLISHING

RELATED APPLICATIONS

This application is a divisional of U.S. patent application Ser. No. 14/095,937, "Method and System of Surface Polishing," filed Dec. 3, 2013, which claims priority to U.S. Provisional Application 61/879,080, "System and Method of Polishing a Surface," filed Sep. 17, 2013, all of which are incorporated herein by reference in their entirety.

TECHNICAL FIELD

This present invention relates generally to a method and apparatus for polishing a surface and, more particularly, to a method and apparatus of polishing a surface using a fast electric discharge.

BACKGROUND

Many semiconductor devices and integrated circuits are manufactured using photolithographic processes. Often in such processes, a circuit design is transferred from a photomask (sometimes called a reticle) to a semiconductor wafer by using an optical imaging scanner/stepper system ("scanner system"). High production yield and quality of the produced circuits relies not just on the precision of the scanner system but also on the quality of the photomask and semiconductor wafer being used. Although many error sources influence the quality of the photomask and semiconductor wafer, key among them is surface flatness and roughness of both the photomask and the semiconductor wafer.

The issue of surface flatness and roughness for photomasks and semiconductor wafers is important in both the near future, as conventional optical lithography is pushed to its physical limits (e.g., the diffraction limit), as well as for future unconventional lithographic processes that are needed to move beyond the limitations of conventional optical lithography. For example, extreme ultraviolet (EUV)/soft x-ray lithographic processes are being explored as one way of replacing or supplementing conventional optical lithography. In EUV/soft x-ray lithography, non-axially symmetric imaging layouts are frequently employed. Such non-axially symmetric imaging layouts place tight restrictions on error sources such as imaging aberrations, distortions and overlay errors that, in turn, increase the surface flatness and roughness requirements of the optical components (including the reticle) and the wafer into the range of nanometers.

Currently, surface polishing in the semiconductor industry is mainly achieved by chemical mechanical planarization/polishing (CMP). Due to technical limitations of this approach, it is likely limited in utility to fabricated devices that can tolerate peak-valley flatness excursions on the order of micrometers or slightly better. Moreover, CMP is a global polishing technique, meaning that an entire chip or wafer is typically polished at once. As such, CMP is known to generate a signature "global bow" and create new surface errors while minimizes others. Other available surface polishing methods (e.g., mechanical polishing, magneto-fluid, or ion beam bombardment methods, etc) are tedious and time consuming, and are not easily transferred to volume-level production environments.

Therefore, what is needed is an improved polishing method that does not suffer from the problems associated with chemical mechanical planarization/polishing while still providing acceptable throughput and high accuracy surface polishing.

SUMMARY

To address the aforementioned problems, some implementations provide a method of polishing a surface of an object disposed within a gas chamber. The method includes generating a pixel map of the surface. The pixel map includes a plurality of pixels including a first pixel and a second pixel. The first pixel corresponds to a first surface error associated with a first location on the surface and the second pixel corresponds to a second surface error associated with a second location on the surface. The method further includes filling the gas chamber with a discharging medium to a predefined pressure, positioning an electrode with respect to the surface such that the electrode is proximal to the first location, and determining if the first surface error meets predefined polishing criteria. In accordance with a determination that the first surface error meets the predefined polishing criteria, the method includes triggering an electrical breakdown of the discharging medium whereby the electrical breakdown results in a discharging pulse that polishes the surface. In accordance with a determination that the first surface error does not meet the predefined polishing criteria, the method includes forgoing triggering of the electrical breakdown of the discharging medium, and repositioning the electrode with respect to the surface such that the electrode is proximal to the second location.

In some implementations, triggering the electrical breakdown includes applying a voltage between the electrode and the surface. The voltage is greater than a breakdown voltage of the discharging medium. In some implementations, the application of the voltage between the electrode and the surface is gated so as to control a temporal duration of the discharging pulse. In some implementations, the application of the voltage between the electrode and the surface is gated using a gas-filled tube.

In some implementations, triggering the electrical breakdown includes applying a preionization signal to a region between the electrode and the surface. In some implementations, the preionization signal is provided by one of a laser or an ultraviolet lamp.

In some implementations, the electrode is a needle-type electrode having a tip. The tip has a distal end disposed proximal to the surface and characterized by a radius of curvature at the distal end within a first predefined range and an included angle within a second predefined range. In some implementations, the first predefined range is one of the group consisting of: 10 nm to 100 nm, 50 nm to 500 nm, and 100 nm to 2000 nm; and the second predefined range is one of the group consisting of: 15 degrees to 20 degrees, 5 degrees to 45 degrees, and 10 degrees to 30 degrees.

In some implementations, the pixel map is generated in real-time using a surface height measurement sensor. In some implementations, the pixel map is generated using a metrology tool prior to the filling, positioning, and determining operations.

In some implementations, the electrode is a respective electrode in an electrode array. The electrode array includes a plurality of electrodes.

To address the aforementioned problems, some implementations provide another method of polishing a surface of an object disposed within a gas chamber. The method includes filling the gas chamber with a discharging medium to a predefined pressure, applying a voltage between an electrode and the surface, calibrating a height of the electrode relative to the surface so as to establish electrical breakdown threshold criteria, and scanning the electrode with respect to the surface so as to sequentially position the electrode over a plurality of locations on the surface, each location characterized by a surface error. When a respective location in the plurality of locations has a surface error that meets the electrical breakdown threshold criteria, electrical breakdown occurs, whereby the electrical breakdown results in a discharging pulse that polishes the surface.

In another aspect of the present invention, a system (e.g., apparatus) is provided which performs any of the surface polishing methods provided herein.

BRIEF DESCRIPTION OF THE DRAWINGS

For a better understanding, reference should be made to the following detailed description taken in conjunction with the accompanying drawings, in which:

FIG. 1-2 is a schematic side-view drawing of a micro fast discharge environment, in accordance with some implementations.

FIG. 2 is a functional block diagram of a micro fast discharge polishing (MFDP) system, in accordance with some implementations.

FIG. 6-1 illustrates an active triggering mode, in accordance with some implementations.

FIG. 6-2 illustrates a passive triggering mode, in accordance with some implementations.

FIG. 6-3 illustrates a preionization mechanism to be used as controlling signal for fast discharging, in accordance with some implementations.

FIG. 10-1 illustrates an example of a scanning path of an electrode array relative to an object that has a square or rectangular shape, in accordance with some implementations.

FIG. 10-2 is illustrates an example of a scanning path of an electrode array relative to an object that has a circular shape, in accordance with some implementations.

FIG. 11 illustrates a layout of a scanning stage having calibration areas, in accordance with some implementations.

FIG. 14-1 illustrates a top view of a library of "needle-type" electrodes, in accordance with some implementations.

FIG. 14-2 illustrates a side view of a library of "needle-type" electrodes, in accordance with some implementations.

FIGS. 15-1 and 15-2 are flow diagrams illustrating a method of polishing a surface, in accordance with some implementations.

FIGS. 16-1 and 16-2 are flow diagrams illustrating a method of polishing a surface, in accordance with some implementations.

Like reference numerals and names refer to corresponding parts throughout the drawings.

DESCRIPTION OF IMPLEMENTATIONS

Figure 1:
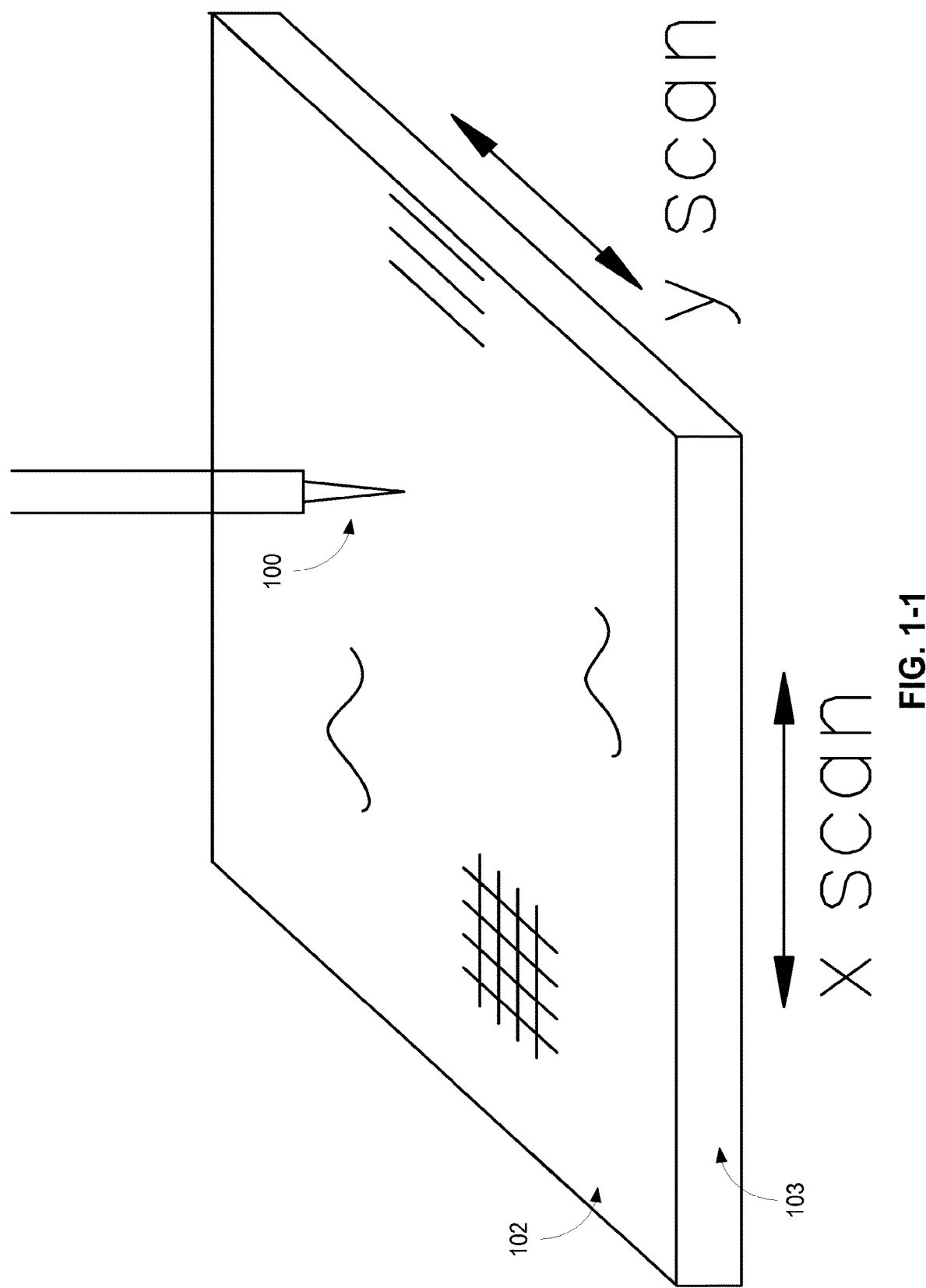
FIG. 1-1 is a schematic perspective drawing of a micro fast discharge environment, in accordance with some implementations.

Reference will now be made in detail to various implementations, examples of which are illustrated in the accompanying drawings. In the following detailed description, numerous specific details are set forth in order to provide a thorough understanding of the present disclosure and the described implementations herein. However, implementations described herein may be practiced without these specific details. In other instances, well-known methods, procedures, components, and mechanical apparatus have not been described in detail so as not to unnecessarily obscure aspects of the implementations.

The present invention described herein provides a system and method of polishing an object (herein referred to as "the object") having a surface to be polished (herein referred to as "the surface").

Modern semiconductor chips and integrated circuits are often manufactured using photo-lithographic processes. One of the key steps among these processes is to transfer a circuit design on a photo-mask or reticle to a semiconductor wafer by using an optical imaging scanner system. The production yield and quality of the resulting circuits rely on not just the precision of the optical scanner system but also the quality of the photo-mask and semiconductor wafer. For example, the uniformity and positioning accuracy of circuit features on the photo-mask and the overlay accuracy of different wafer layers are some of the key factors that determine the final quality of semiconductor chips and the circuits thereon. Although many error sources can influence the accuracies described above, and contribute against a total error budget of modern wafer production, a few important error sources play particularly determinate roles. Chief among these error sources are surface flatness and roughness errors on both the photomask and the wafer, which cause problems in patterning overlay or uniformity.

With the evolution of technology and the increased demand for smaller, faster, and more powerful devices, the fields of semiconductor manufacturing and chip design are moving into the nanometer realm. That is to say, modern devices are characterized by a representative line-width, sometimes called a space-width, on the order of nanometers or tens of nanometers. According to some predictions, the minimum feature size of circuits on wafers will soon reach the 10-20 nanometer range. This trend is expected to continue for a foreseeable time, so that the total error budget of wafer production with high yield requirements will soon be greatly reduced. Furthermore, due to the limited capability of conventional optical imaging systems, which are limited by optical aberrations and the diffraction limit, the semiconductor industry is expected to look towards unconventional lithographic systems (e.g., extreme ultra-violet (EUV) or soft x-ray lithographic systems), in which a non-axial symmetrical imaging layout is required. This imaging approach brings with it much tighter requirement on optical aberrations, distortions and overlay errors, and therefore implies strict requirements for surface accuracies such as flatness and roughness. These surface accuracy requirements will extend to such surfaces as the photomask surface (e.g., the photomask pattern surface), the imaging surface (wafer pattern surface and substrate surface) and surfaces of optical elements inside the lithographic system. For example, a surface flatness error (representing low and middle spatial frequency portions of a surface profile error) and a surface roughness error (representing middle and high frequency portions of the surface profile error) contribute significant amounts to the total error budget, especially in terms of overlay error. Even small amount of flatness error on the wafer surface can impact device performance and process variation and therefore affect production yields. Such error sources become more apparent and more severe when the wafer production moves into the realm of nanometer linewidths and beyond.

As an example, some typical requirement data for future semiconductor production can be examined. According to some industry predictions, a maximum allowable flatness error (peak-to-valley) of 10-15 nm (nanometers) for photomask substrates and multi-layer blanks is expected for critical layers of the 16 nm line-width generation of semiconductor wafers. Root-mean-square (RMS) roughness error on photomask substrates for the 16 nm line-width generation is expected to be on the nanometer scale. The requirements of surface flatness and roughness on wafer blanks and processed wafers are severely restrictive as well. These requirements impose huge challenges for the future success of the semiconductor industry.

Currently, surface polishing in the semiconductor industry is mainly realized by a chemical etching and mechanical polishing (CMP) method. Due to technical issues with this approach, surface polishing with CMP is expected to be limited to around surface flatness errors (peak-valley) on the order of micrometers or hundreds of nanometers. Because CMP is a global polishing approach (e.g., the entire wafer or chip, or at least a large portion thereof is polished at once), CMP polishing tends to generate a signature "global bow" and also creates new surface errors while attempting to minimize others. Other available surface polishing methods implemented in different fields (e.g., the mechanical polishing, magneto-fluid, or ion beam bombardment methods), are tedious and time consuming, and thus cannot be easily transferred into a high throughput production environment such as the semiconductor industry. That is, to improve the throughput time of high accuracy surface polishing a new type of polishing technique is needed.

The present invention utilizes a fast electric discharge over a small region to destroy micro-scale surface undulations (sometimes referred to herein as "hills"). The discharging occurs between a sharp tip of a "needle-type" electrode and a surface of an object to be polished (herein, "the surface"), which have a strong electric field established between them. Due to the nature of the sharp shape of the tip of the electrode, the electric field between the electrode and surface is very sensitive to variations of the surface undulations. A discharge circuit is used to generate very short discharging pulses on a timescale ranging from nanoseconds to micro-seconds, (sometimes called "fast discharging"). Because the discharging occurs between the tip of electrode and the surface and only lasts a short period of time, the discharging is localized both temporally and spatially, which results in high accuracy polishing. While the electrical discharging region is specifically controlled by the electrode design and the circuit, the surface to be polished can be continuously scanned using a stage, either translational or rotational, so that the entire surface can be polished with production worthy throughput time. Since the surface polishing improvement depends on the surface accuracy of the incoming surface, the method is repeatable, meaning that better surface flatness and roughness specifications can be obtained by iterating the method repeatedly.

Additionally, the method described herein is valid for both flat surface polishing and curved surface polishing (e.g., spherical or other shaped surface polishing). For polishing curved surfaces, an appropriate electrode array is designed based on a model shape (e.g., a model of the surface to be polished) and a scanning/rotating mechanism. Furthermore, the principle of the present approach can be extended to other fields, such as localized surface etching or surface repair, and can also be extended to use different types of pulses (e.g., other than electric) for surface polishing or figuring. The present invention is scalable to large-scale production and designed to be modular for compatibility with supporting units, e.g., by changing the electrode array design.

An aspect of the present invention is to provide a novel high accuracy surface polishing system, for both flat surfaces and curved surfaces, which uses a micro-scale fast discharge approach with nanosecond pulse duration in a high pressure gas chamber (e.g., greater 1 atm (atmosphere)). In general, this system can be used for surface polishing covering a wide range of materials and applications, said materials including conductive materials, semiconductive material, and insulated material coated with a conductive coating or liquid film. It is suitable for high accuracy surface polishing because this novel method provides polishing capability within regions down to the nanometer scale, which is controllable temporally in the range of nanosecond pulse duration.

Another aspect of the present invention includes a rotational or translational stage with high positioning accuracy for scanning the object, which, in some implementations, is inside a high pressure gas chamber (sometimes called a "fast discharge chamber") and is monitored and controlled by an optical interferometer and/or an air-bearing system. The stage provides controlled movement in an x-y plane and high precision leveling in a z-direction. The fast discharge chamber provides an environment for surface polishing which is capable of supporting both a vacuum condition as well a condition in which the chamber is filled with a discharging medium to a high pressure with a gas pressure value ranging from a few atmospheres (ATM) to tens of atmospheres (ATM). The gas pressure value is determined in accordance with the requirements of the discharging pulse duration as well as the breakdown voltage of the discharging medium. In general, shorter pulse durations require higher pressure and the help of a quick switching mechanism (described below). Besides the stage, the system includes one or more electrodes, which are collectively referred to as an "electrode array" (i.e., an electrode array is one or more electrodes). The system also includes a discharging medium flowing and cycling sub-systems for sustaining uniform discharge characteristics and extending the lifetime of the discharging medium, a fast discharge electrical circuitry sub-system, and a discharge monitoring and controlling sub-system. The apparatus can operate in an "active" fast discharge mode or "passive" fast discharge mode, and each mode can have differing arrangements to support the generation of very short electrical discharging pulses.

One advantage of the present invention is that its unique fast discharge approach can contain polishing to within a discharging region of the fast discharge, and therefore the surface polishing is localized both temporarily and spatially. In principle, the discharge occurs between a tip of an electrode (e.g., within an electrode array) and a surface hill. The strength of the electric discharge is extremely sensitive to the height of the surface due to the steep variation in the electric field strength, and is therefore localized to the hill. The discharge process only lasts for a period of a few nanoseconds or tens of nanoseconds, which can effectively prevent the extension of the discharge into neighboring regions. The realization of localized fast discharging, both temporarily and spatially, can be controlled and optimized by the geometrical design of the electrode, the pulse-width of discharging pulse, the triggering mechanism of the discharging, the pressure and mixture of discharging medium, and others. Therefore, these factors provide a wide range of processing recipes and an ability to tune the system to offers extensions to a variety of applications.

Another advantage of the present invention is the ability to modify the breakdown voltage of the discharging medium by tuning the gas pressure value of the discharging medium. Thus, one can modify the amount of electrical energy injected into the surface hills so that the injecting intensity generated by discharging process can be moderated. By adjusting the gas pressure value of the discharging medium and the switching time of a triggering switch, the breakdown voltage and pulse duration can be tuned and optimized for different materials and purposes. Based on input data of the surface flatness and roughness, the discharging distance between electrode and the surface undulations can be calibrated using a reference plane. Due to the sensitive nature of electrical discharging around a sharp tip of a "needle-type" electrode, a few percent variation of the surface height can cause tens of percent or even larger variation of the electric field strength between the electrode and the surface hill, which can trigger the discharging process automatically. A steep rising edge of a short discharging pulse further enhances this process.

Figure 9:
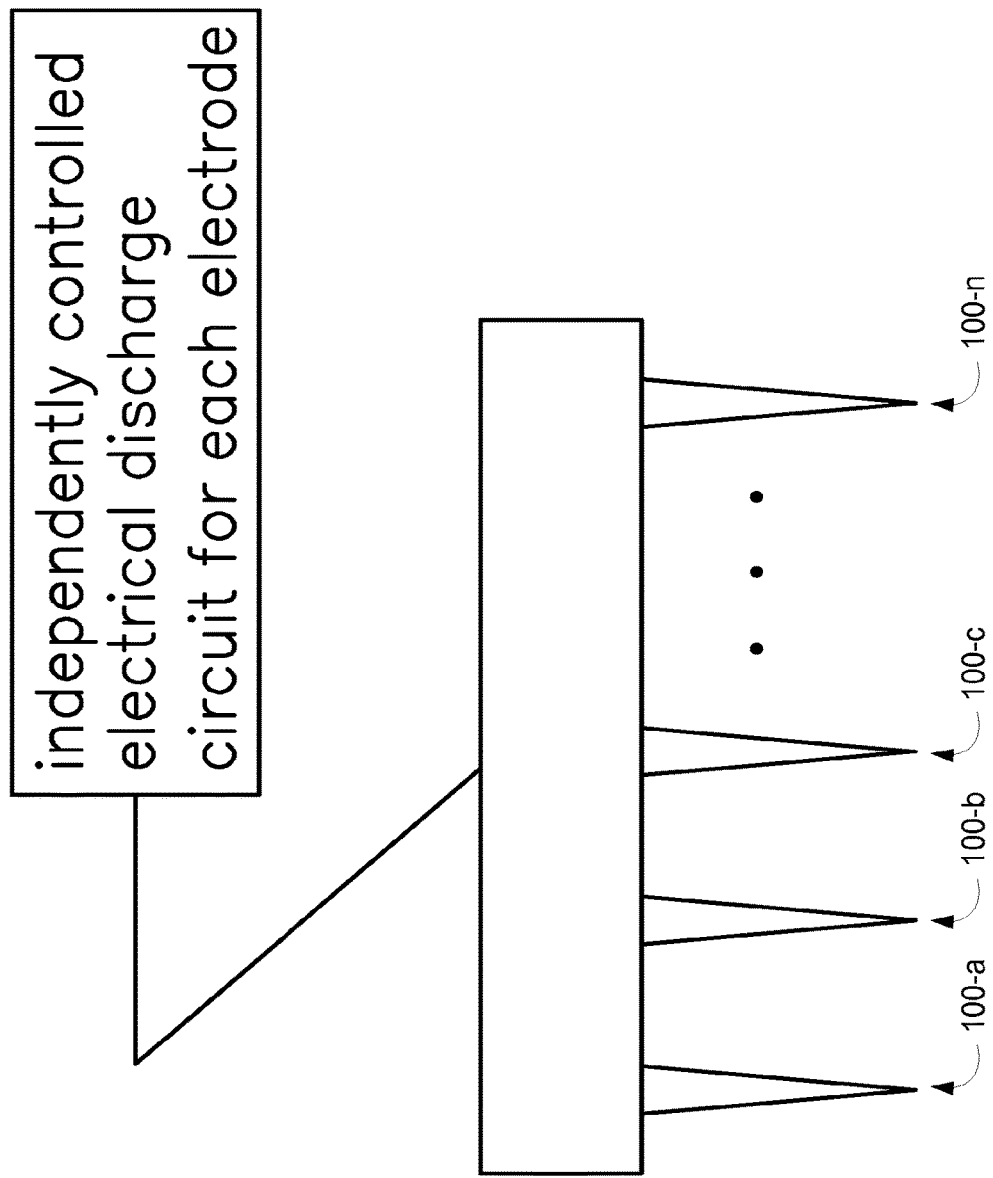
FIG. 9 illustrates a one-dimensional "needle-type" electrode array, in accordance with some implementations.

In yet another aspect of the present invention, a fast discharging layout is used in concert with a 1-dimensional electrode array or a 2-dimensional electrode array to improve the polishing efficiency and production throughput, which is important for high volume production. The electrode array uses either equally-distanced electrodes or an asymmetrical arrangement of electrodes. In some implementations, the asymmetrical arrangement of the electrodes is characterized by separations between the neighboring electrodes that are differing prime numbers of unit distances apart (e.g., 1 unit distance, 3 unit distances, 5 unit distances, 7 unit distances, 11 unit distances, etc., where the unit distances can be measured in any suitable unit, such as nanometers, microns, mils, etc.) so that the scanning paths from the different electrodes will not overlap while the stage is scanning in either a rotational scanning mode, a translational scanning mode, or combination thereof. As shown in FIG. 9, each electrode within the electrode array is independently controlled for charging, triggering and discharging by its own electrical circuit connected to an electrical energy storage reservoir.

The triggering mechanism of the micro fast discharging can be either an active discharging mechanism (or mode) or a passive mechanism (or mode). In the active mode, the system receives surface undulation data as an input from, for example, a surface metrology system (e.g., flatness metrology system). The system then converts the input data into pixel data matching a scanning path of the scanning stage. The pixel size determines the minimum polishing region and the fineness of the polishing process. The pixel size is determined by a convolution of the minimum pixel size of the metrology data and the electrode design. The scanning path can optionally be from pixel-to-pixel or from one unit to the next unit that contains a pixel value. For ultra-fine polishing, if a single pixel of the metrology data is large compared to a localized region of surface error, the scanning unit or discharging unit can be split by scanning path design. Using the metrology data, the discharging condition at each pixel is determined and the discharging is triggered by a triggering signal (e.g., an electrical and/or optical signal).

In some circumstances, the passive mode is used when either metrology data is not available or it is not beneficial. In such circumstances, the discharging can be self-triggered based on a pre-defined threshold condition (e.g., a threshold distance between the electrode tip and a surface hill). Along a scanning path, a discharge will occur at a location when a surface parameter breaks the threshold. In some implementations, the pre-defined threshold condition represents a maximum acceptable level of surface topography variation, and it is determined by surface polishing specifications of the outgoing objects under incoming material condition. The comparison between the pre-defined threshold condition and the surface parameter is performed at each pixel. In some implementations, the surface parameter (e.g. the distance between the tip and the surface) is measured in real-time using various methods (e.g., an optical height sensor or by measuring a variation of the electric field strength around the tip of the electrode). Due to the geometrical structure of the electrode, the variation of the electric field strength around the tip of the electrode is sensitive to the variation of surface flatness and roughness and therefore has a great capability for ultrafine surface polishing.

Another aspect of the present invention is the flowing and cycling of the discharging medium (gas mixture) within the discharge chamber, so that heating caused by the discharge can be dissipated, the discharging medium lifetime can be extended, and the discharging quality can be improved. The process of the discharging medium flowing and cycling also cleans debris from the surface while the discharging occurs. The determination of the gas flow rate is determined in accordance with the discharge repetition rate. In each cycle, a small amount of fresh discharging medium is injected into a flowing channel of chamber and an equal amount of used discharging medium is drained out and stored in a processing storage cylinder for filtering and reuse. Real-time monitoring and filtering of the discharging medium is used for continuous high volume production.

Considering the high accuracy of the surface before and during polishing, in some implementations, the electrode and/or electrode array are calibrated before and/or during the polishing process. Some implementations of the stage include features that provide measurement and calibration capability for surface leveling and dynamic calibration and micro-adjustment of the electrode array. In some implementations, a plurality of predetermined points on the surface are monitored and corresponding z-coordinate is measured for each point using an optical interferometer or height sensor before and/or during the stage scanning movement. The z-coordinate (e.g., height) of these points can be used to determine, for example, one or more of a pitch, a roll, and a yaw, as well as an overall height offset of the surface with respect to a reference surface (e.g., fiducial surface). These quantities can then be used for calibration and adjustment in a real-time mode. In some implementations, along the sides of the stage, (however, separate from the polishing object), there are one or more calibration panels that have very high surface accuracy, which serve as reference region for electrode array calibration. The electrode array calibration is optionally performed before the polishing and after each cycle of stage scanning. For this reason, the electrode array is mounted on an electrode head that is capable of performing adjustment in the z-direction, e.g. by using an ultra-fine screw unit.

Due to the very strong electric field strength surrounding the tip of the electrode during discharging, the shape of electrode tip is sometimes eroded or otherwise changed and therefore the polishing quality can be degraded. To improve the quality and efficiency of the polishing process, a library of electrodes (e.g., a cassette or magazine of electrodes) is provided in the present invention, which provides a way to quickly exchange electrodes when the degradation of an in-use electrode drops below a pre-defined criteria (e.g., a pre-defined criteria set by a user). After the electrode exchange, a new electrode is calibrated using the calibration panels. The electrode library is especially valuable when a large electrode array is utilized, which, as mentioned above, is used to greatly increase the throughput of polishing process.

As another aspect of the present invention, multiple micro fast discharge polishing (MFDP) systems can be arranged in series so a first system's outgoing object is the incoming object of a second system. Likewise, the second system's outgoing object becomes a third system's incoming object, and so on. In this way, each system only needs to polish a limited and pre-defined range of surface errors and the system's calibration and operational tuning for better stability is simplified. In addition, one or more of the MFDP systems can have multiple discharge chambers with single central control unit, which can greatly enhance the efficiency and throughput of the polishing process, especially for those objects that have similar surface qualities (e.g., similar peak-valley flatness ranges) and the same polishing requirements. Because the system experiences vacuum conditions and undergoes filling of the discharging medium during object loading and unloading, to reduce the cycle time of the polishing process and enhance the system productivity, a library for object storage (e.g., a cassette or magazine to hold wafers) is, in some implementations, attached to the discharge chamber. The library for object storage is operated under the same gas pressure conditions as the discharge chamber (albeit, optionally with no gas flow). In this way, the discharge chamber can maintain its operational conditions until all of the objects in the library are polished.

To achieve and maintain high throughput in a manufacturing environment, some implementations utilize high speed scanning and a high discharging repetition rate. Therefore, in some implementations, the system includes corresponding high speed electrical charging and discharging systems. Circuitry for a single fast discharge (e.g., without recharge) and applications thereof are well-known in the art and have been utilized in different fields. However, in some circumstances, a single charging/discharging unit is not sufficient to meet the requirements of high scanning speed, decreased size of the polishing pixel and implementation of multiple electrodes. To meet these requirements, some implementations provide an energy reservoir that is attached to the MFDP system, which is designed to realize the high speed electrical energy charging and discharging. In some implementations, the reservoir contains an array of energy storage units that have cylindrical symmetric layout, although other layout types are possible as well, and all of units are independent of each other. There are two electrical sub-systems within the reservoir: a charging sub-system and a discharging sub-system. These sub-systems connect to the reservoir independently. In the discharge processing, each individual electrode of the electrode array is connected to a respective energy reservoir unit in an exchangeable way. When the system detects that an energy level of the respective energy reservoir unit drops below a pre-defined limit, the electrode connected to the respective energy reservoir unit is switched to a new energy reservoir unit, while the exhausted energy reservoir unit is then coupled to the charging process.

To avoid interference between the MFDP system and other process equipment surrounding it, some implementations of the MFDP system provide an environmental control enclosure that includes multiple environmental control capabilities including electromagnetic (EM) field shielding, tight vibration isolation, acoustic noise isolation and temperature variation control. A discharging medium purification for particle filtering is also included in the environmental control enclosure.

Overall, the MFDP system provides a novel method and technical approach for high accuracy surface treatment. Although many parameters and system functions contribute to this new capability, a few key parameters determine the fundamental achievable capability. These include a minimum size of the electrode tip, a minimum distance between the electrode tip and the surface and an ability of the scanning mechanism (e.g., the scanning stage) to accurately control position, as well as the minimum achievable electrical temporal pulse-width of the discharging pulse. As an example, an electrode tip with a characteristic size on the order of tens of micrometers or a few micrometers, with a temporal pulse-width of the discharging pulse on the order of hundreds of nanoseconds, is suitable for micrometer or sub-micrometer surface polishing processes. As another example, when using an electrode with a characteristic size of a few nanometers (e.g., up to tens of nanometers) with a temporal pulse-width of the discharging pulse on the order of a few nanosecond (e.g., as measured by the peak-valley flatness error or low-medium spatial frequency surface error), nanometer level polishing is achievable.

As currently understood, $\lambda/100$ surface polishing accuracy is the so-called classical limit of conventional technologies, where $\lambda$ is a wavelength of a characteristic light being used (e.g., a wavelength of helium neon (HeNe) laser radiation, which is 632.8 nm). This means that the current classical limit is about 6-7 nm peak-valley surface accuracy within a surface area of few hundred square centimeters. Moreover, this is achievable only in a slow and time consuming way and therefore only suitable for small quantity production. The MFDP system and technology described herein overcomes this limitation because of its spatially and temporally localized nature, allowing for point-to-point surface polishing using a discharging pulse generated by breakdown of a discharging medium subject to an electric field. This is used in conjunction with high speed object scanning for high volume manufacturing.

Reference will now be made in detail to various implementations, examples of which are illustrated in the accompanying drawings. In the following detailed description, numerous specific details are set forth in order to provide a thorough understanding of the present disclosure and the described implementations herein. However, implementations described herein may be practiced without these specific details. In other instances, well-known methods, procedures, components, and mechanical apparatus have not been described in detail so as not to unnecessarily obscure aspects of the implementations.

Operational Theory

Figures 1, 2:
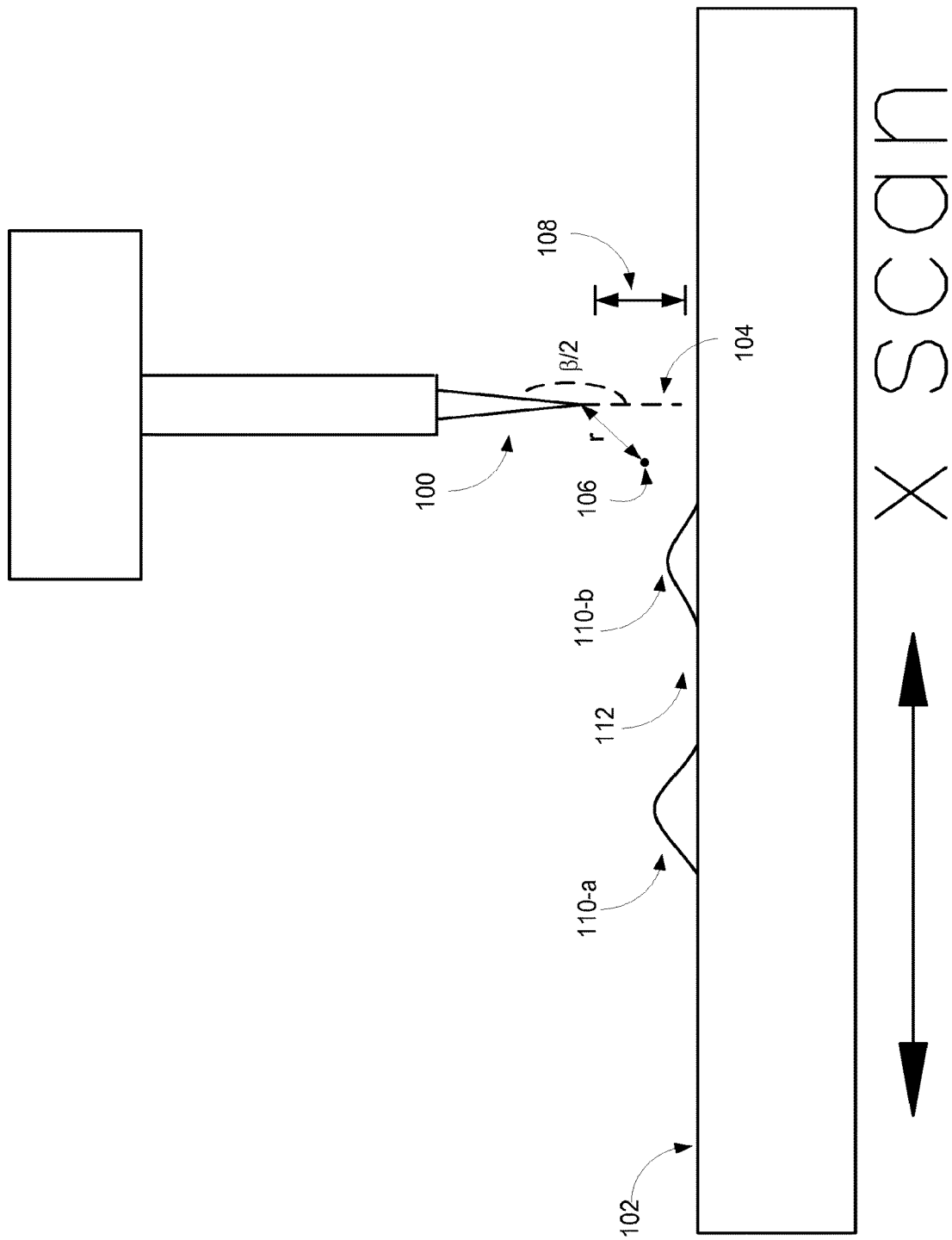
Figure 2:
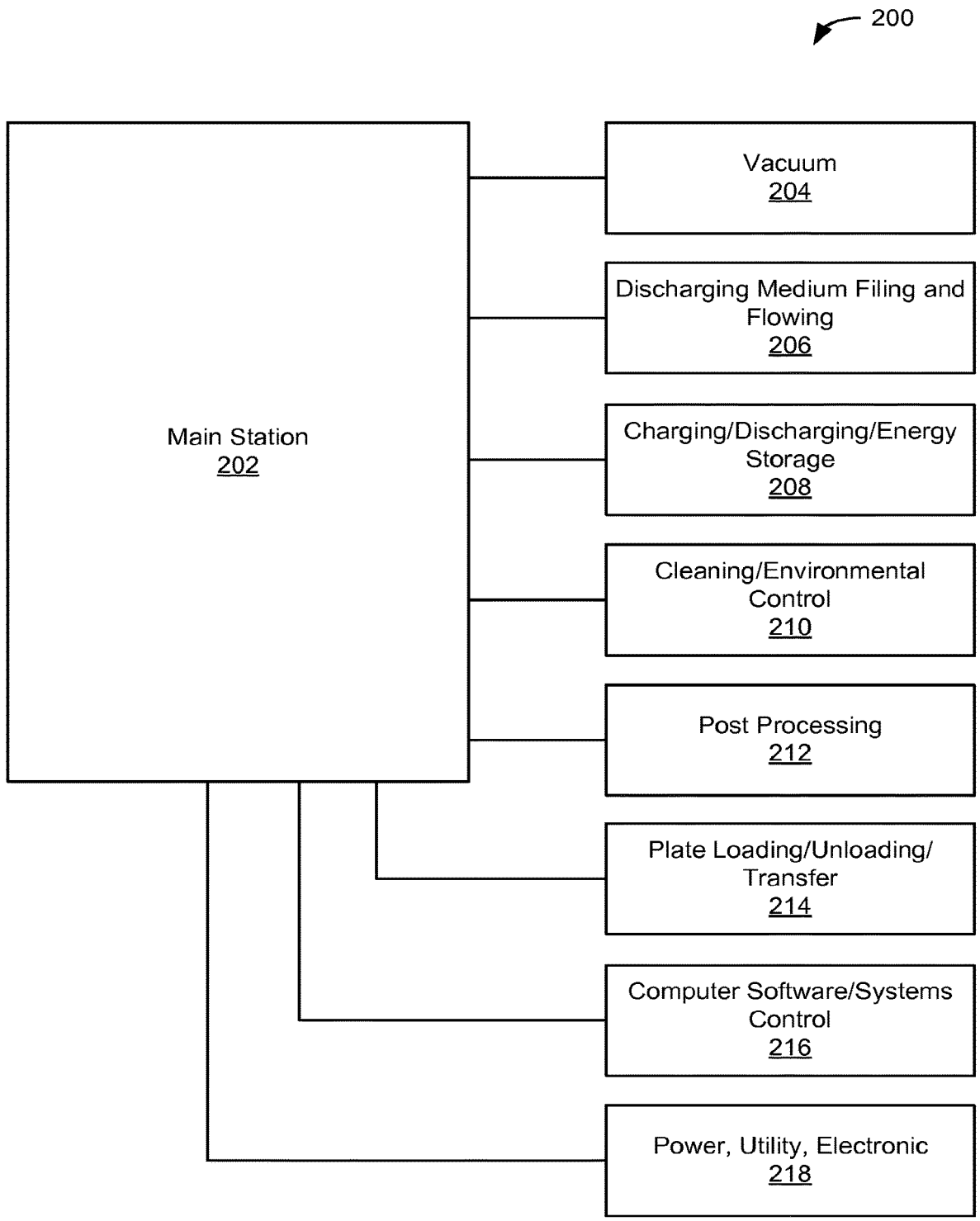

Now referring to the drawings, FIGS. 1-1 and 1-2 illustrate the operational theory of a micro fast discharge polishing (MFDP) system, in accordance with some implementations. An electrode 100 scans a surface 102 of an object 103 to be polished. A region of space between the electrode 100 and the surface 102 defines a discharge cavity 104. A discharging medium (e.g., a gas mixture) is introduced into the discharge cavity, and a voltage is applied between the electrode 100 and the surface 102 resulting in an electric field within the discharge cavity 104 characterized by an electric field strength, E. A discharging pulse occurs when a variation in the distance between the electrode 100 and the surface 102 or a variation in the voltage applied between the electrode 100 and the surface 102 results in electric breakdown of the discharging medium. In some implementations, the electrode 100 does not move within the x-y plane and only performs height adjustments along z-direction, while the scanning stage that holds the object 103 performs the scanning movement in both the x and y directions.

In some implementations, the electrode 100 is a "needle-type" electrode meaning that the electrode 100 has a sharp tip that is proximal to the surface. Due to the sharp tip of the electrode 100, the electric field strength surrounding the electrode tip is very sensitive to variations of the surface's 102 topography. The electric field strength near the tip of the electrode 100 is proportional to $r^{(\pi/\beta - 1)}$, where r is the distance between the tip and a field point 106, and β is an outer angle of the tip. When β approaches 2π and r approaches 0, the electric field strength is extremely large and sensitive to variations of r. That is to say, a small amount of variation in the distance between the electrode 100 and the surface significantly changes the electric field strength. This effect becomes more severe if the electrode tip is very close to the surface 102. Therefore, this geometrical structure has great potential for high accuracy surface treatment, and the resulting surface treatment is limited primarily by the size of the electrode tip and the minimum distance between the electrode tip and the surface 102 that can be achieved. In some implementations, a reference surface for polishing is correlated to a threshold distance 108 that will trigger discharging. Where the gap between the surface 102 and electrode 100 is narrower than the threshold distance 108, the electric field strength generated by a fast discharging pulse becomes stronger and therefore the strength delivered by the discharging pulse is stronger on the hills 110 (e.g., hill 110-a and hill 110-b) of the surface 102 than in the valleys 112. This strength increase is especially sensitive both because of the electric field created by the applied voltage and because of the nature of breakdown discharge from an electrode tip, which is sensitive to the distance change and field strength increase in a non-linear fashion. The present technique self-adjusts the polishing strength in accordance with the surface error height. In other words, a higher hill 110 (e.g., with respect to the electrode tip) will receive more polishing, while a lower hill 110 will receive less polishing compared to the former case, provided that the electrode tip maintains an unchanged height in the z-direction. Because the discharging pulse is confined between the electrode tip and the hill 110, this polishing approach is sometimes referred to herein as "point-to-point" surface polishing. In nature, it has huge potential to "crash" hills 110 and achieve very high surface polishing accuracy.

Inside the polishing chamber, a discharging medium (e.g., a high pressure gas mixture) is filled and flowed continuously. Discharging pulses are generated via breakdown of the discharging medium. The discharging pulses are characterized by a pulse-width that depends on the characteristics of the discharging medium (e.g., composition, pressure, etc.), the characteristics of the discharging cavity (e.g., electrode shape, distance between the electrode and the surface, etc.), as well as characteristics of a fast discharge circuit described below. In this way, discharging pulses can be generated with short pulse-widths (e.g., from a few nanoseconds to tens nanoseconds). During this time, electrical energy stored in the fast discharge circuit is released into a very small spatial region restricted by the sharp tip of the "needle-type" electrode. Thus the discharge process is well contained around non-flat spots on the surface, both in time domain and spatial domain, so that over-polishing and/or damage of neighboring areas is avoided.

There are multiple system parameters that a user can tune for different applications and specifications (e.g., flatness requirements). For example, the pressure and composition of the discharging medium, the size and shape of the electrode, the composition of the electrode, the mechanism of discharge triggering and gating, the energy release rate and the pulse duration can all be tuned or otherwise adjusted. Because of this flexibility, this novel technology provides a broad range of capabilities that are suitable for different applications in various fields. To name a few, the systems, methods, and processes described herein provide ultra-fine surface polishing or treatment on wafers and photomask substrates as well as patterned surfaces used in the semiconductor industry. In addition, the system, methods, and processes described herein can provide surface polishing in optical component manufacturing, or in other fields that need highly precise surfaces. The systems, methods, and processes are capable of polishing various materials (e.g., conductors, or semiconductors, or insulating material coated with a conductive coating). By using various molds and tooling as well as different scanning mechanisms, this surface polishing capability can be extended from flat surfaces to curved surfaces. For example, for spherical surface polishing, the object can be scanned or rotated around a spherical center, while an electrode array can be mounted on another spherical surface that has common spherical center with the object.

Operational Structure and Layout

FIG. 2 shows a block diagram of a micro fast discharge polishing (MFDP) system 200 of the present invention. System 200 includes a main station 202 that performs the polishing operation and several supporting sub-systems, including: (1) a vacuum sub-system 204 for guaranteeing the purity and proportion of the discharging medium (e.g., after object loading and/or unloading); (2) a discharging medium filling and cycling sub-system 206; (3) an energy storage sub-system 208 for electric charging and discharging support; (4) a cleanliness and environment control sub-system 210; (5) a post-processing sub-system 212, for discharge debris clean-up and residue charge removal; (6) an object loading/unloading/transferring sub-system 214 optionally including loaders, clean room robots, and so on; (7) a computer sub-system 216 for software and automation; and (8) a power, utility and electrical control sub-system 218. The structure and layout of present invention are designed for practical integration into high volume manufacturing environments.

Figure 3:
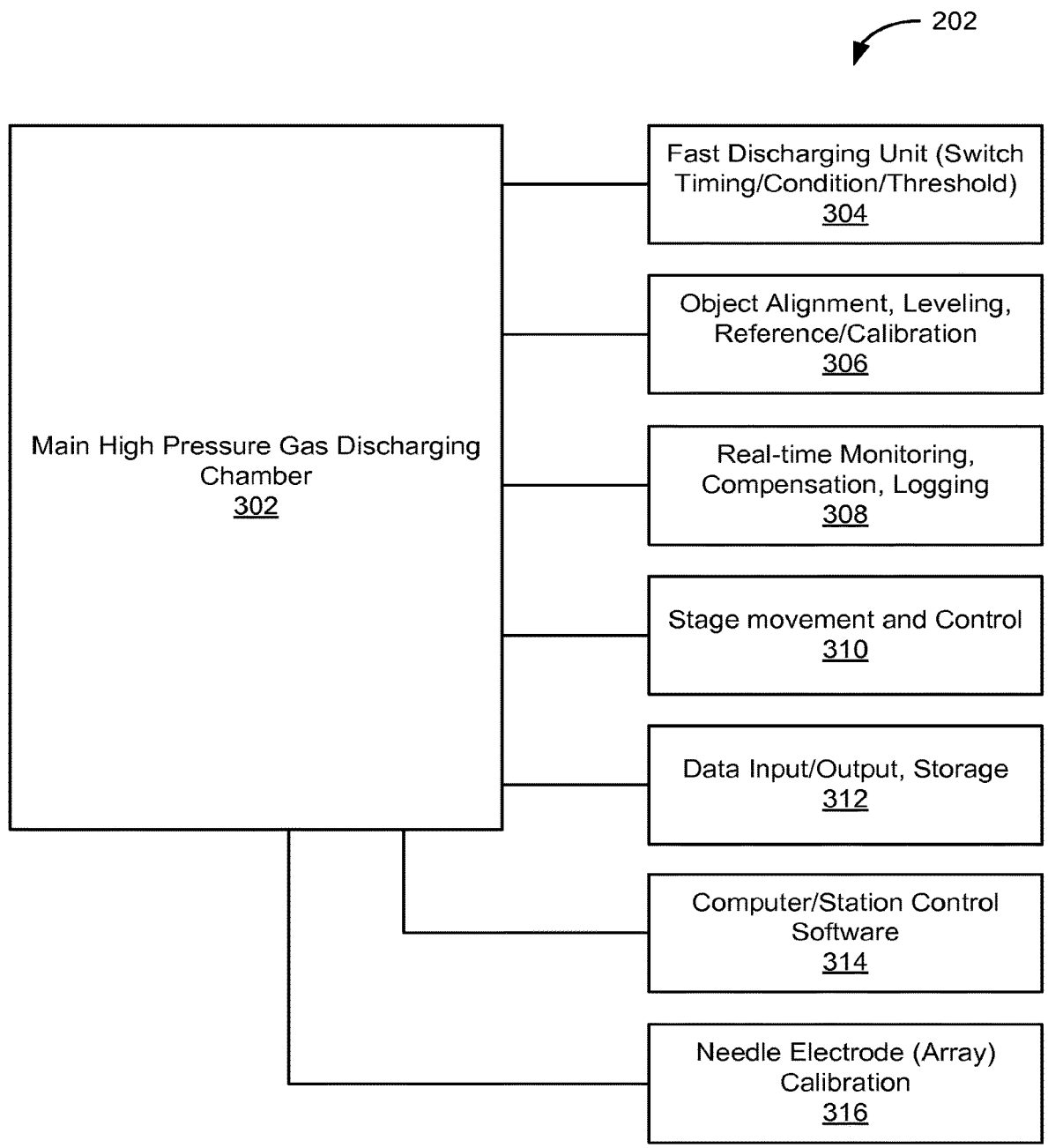
FIG. 3 is a functional block diagram of an MFDP station containing the MFDP system of FIG. 2, in accordance with some implementations.

FIG. 3 shows the functional block diagram of the main station 202. The central part of the main station is a high pressure gas fast discharge chamber 302. Other optional sub-units include: (1) a fast discharge control sub-unit 304 for discharge timing/cut-off control, and determination of threshold conditions; (2) an object alignment, leveling, and reference plane calibration sub-unit 306 for aligning, leveling, and determining a reference plane of the surface of the object; (3) a real-time monitoring, compensation and logging sub-unit 308 for automation of, for example, polishing, scanning, etc.; (4) a rotational and/or translational stage unit 310 for controlling movement of the object and performing tasks such as calibration and self-adjustment; (5) a data input/output (TO) unit 312 for retrieving, storing and handling data (e.g., metrology data, discharge currents and times, etc); (6) a computer algorithm, station control and software sub-unit 314; and (7) a electrode (array) calibration sub-unit 316.

Figure 4:
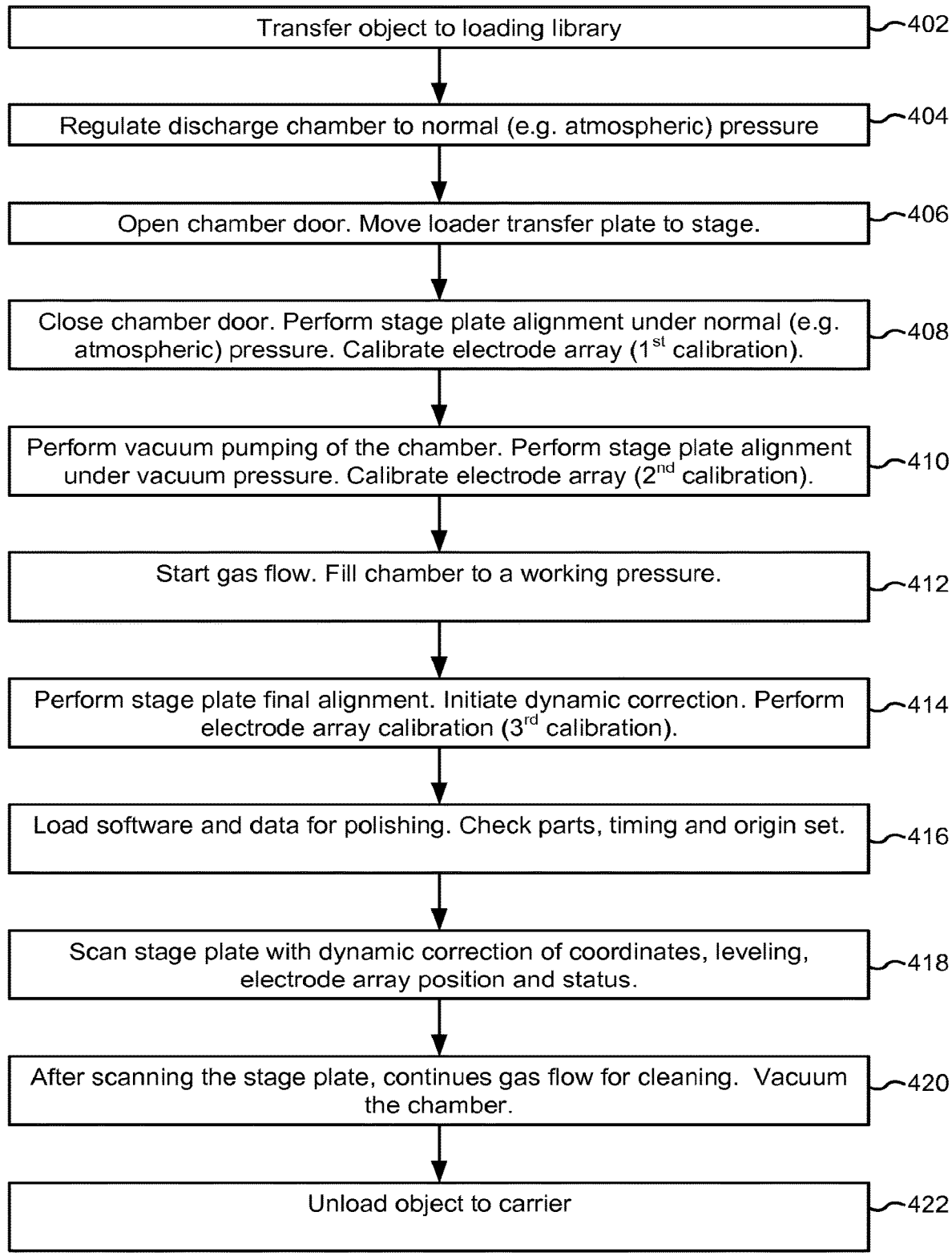
FIG. 4 is a functional block diagram of a process of micro fast discharge based surface polishing, in accordance with some implementations.

FIG. 4 is a flow chart of a polishing method 400. In some implementations, polishing method 400 is implemented on the system 200. Because the incoming and outgoing objects on the system 200 generally have high accuracy surfaces and are, in some circumstances, held to extremely high cleanliness requirements, in some implementations, all of the operations of the method 400 are contactless (e.g., do not touch the surface) and are handled by a robot.

Method 400 includes transferring (402) one or more objects to a loading library of the system. In some implementations (e.g., for use a high volume production environment), multiple objects are stored in a single cassette or magazine and transferred into the loading library at the same time (e.g., the system loads them in the loading (storage) library and processes them serially or in parallel).

Because of the need to load and unload the objects (e.g., wafers), the discharge chamber 302 cycles between dry air and the discharging medium. To this end, the method 400 includes regulating (e.g., venting)(404) the discharge chamber 302 to normal (e.g., atmospheric) pressure. In some implementations, the discharge chamber is vented under a positive pressure of an inert gas such as nitrogen.

Method 400 further includes opening (406) the chamber door and loading one or more objects (e.g., those objects in the loading library) onto a stage (e.g., onto a chuck that mounts the object to the stage). Method 400 further includes closing (408) the chamber door, and performing an initial alignment of the stage at normal (e.g. atmospheric) pressure. In some implementations, the initial alignment is a gross alignment. In some implementations, the electrode array undergoes an initial calibration.

The method 400 further includes vacuum pumping (410) of the chamber (e.g., for cleanliness). A stage alignment is performed under vacuum pressure and the electrode array is calibrated for a second time.

The method 400 further includes starting (412) gas flow of the discharging medium. In this manner, the chamber is filled with the discharging medium to a working pressure.

The method 400 further includes performing (414) a final stage alignment (e.g., a fine alignment), initiating dynamic correction, and performing a third electrode array calibration.

The method 400 further includes loading (416) software (e.g., controls, user interface software, etc.) and data (e.g., metrology data in the active mode) for polishing. A parts, timing and origin set check is also performed, in accordance with some implementations.

The method 400 further includes scanning (418) the stage to perform polishing with dynamic correction of coordinates, leveling, electrode array position and status. In some implementations, the dynamic correction of coordinates is a real-time correction that is performed in the x-y plane as well as in the z-direction. In some implementations, the dynamic correction is performed after a particular path is scanned (e.g., at the end of a "line-scan" across the object). In some implementations, while performing the dynamic calibration and alignment after the scanning path, the position of electrode tip is measured and adjusted. If necessary, an electrode in the electrode array is swapped and returned to the correct position relative to the object.

After scanning the stage, gas flow is continued (420) for cleaning. After a predetermined condition is met (e.g., after a predetermined amount of time that the gas flow is continued) the chamber is pumped to vacuum levels.

Finally, the method 400 includes unloading (422) the object to a carrier (e.g., a track that will move the object to a wafer box, magazine, or cassette for unloading).

In some circumstances, the discharge chamber 302 is vacuumed before and after each gas switch (e.g., operation 410 is repeated). However, in some circumstances, the vacuum level of the discharge chamber 302 is not very high for the object loading/unloading operations. To save cycle time and improve throughput, in some circumstances it is beneficial to include an internal storage library that can contain multiple object (e.g. a wafer lot box, cassette, or magazine). When the storage unit has the same gas conditions as the discharge chamber 302, the polishing process will continue without the need to switch between the discharging medium and a vented condition until the all of the objects in the loading library are processed. The resultant quality of the polishing process relies upon several factors: the quality of the calibration of electrode array, the object alignment and the ability to perform the real-time correction of the relative position between the electrode array and features (e.g., "hills") of the surface.

The details provided with reference to the method 400 are only intended to provide an example of a method for polishing a surface and are not intended to limit the claims that follow. For example, the requirements and procedures of calibration and alignment may vary.

Main Discharge Chamber

Figure 5:
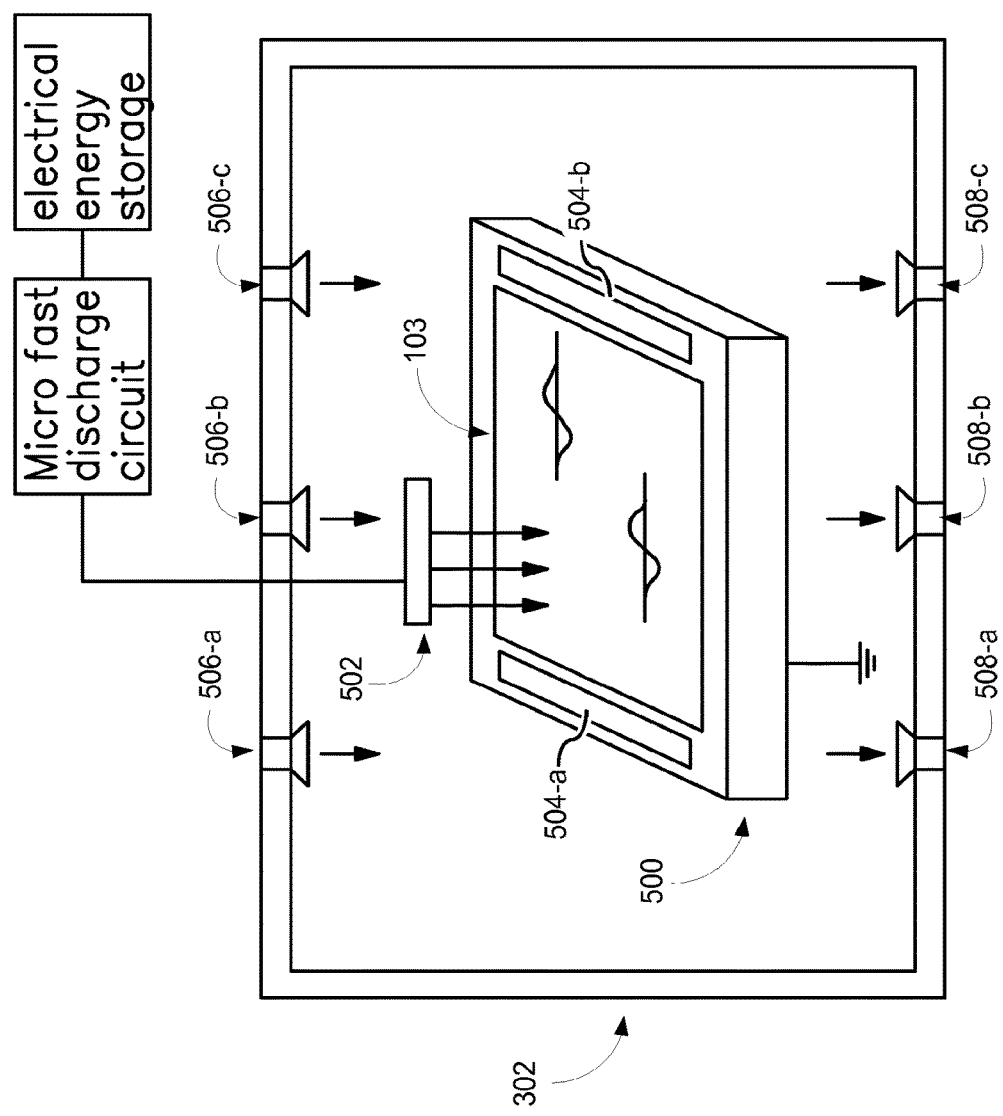
FIG. 5 is a schematic of an MFDP chamber, in accordance with some implementations.

FIG. 5 shows a schematic of the discharge chamber 302, in accordance with some implementations. The discharge chamber 302 provides an environment for high accuracy surface polishing and isolates the discharging process so that the process inside the discharge chamber 302 and activity outside the discharge chamber 302 do not interfere with each other. The discharge chamber 302 includes multiple sub-units, including: (1) a scanning stage 500 that holds the object 103 (e.g., with a vacuum chuck) and moves the object 103 in accordance with user-defined procedures, (2) an electrode head 502 that contains an electrode array and movement controls, (3) a library of electrode arrays for electrode replacement, (4) a gas flow control sub-unit, (5) a monitoring sub-unit for process checking and tuning, and others. In some implementations, the stage is electrically grounded and the electrode head is held at a negative voltage.

In some embodiments, the stage 500 also includes one or more calibration panels 504 (e.g., calibration panel 504-a and calibration panel 504-b), which are described in greater detail below.

In some embodiments, the discharge chamber 302 includes one or more gas inlet ports 506 (e.g., gas inlet port 506-a, gas inlet port 506-b, and gas inlet port 506-c). In some embodiments, the discharge chamber 302 includes one or more gas outlet ports 508 (e.g., gas outlet port 508-a, gas outlet port 508-b, and gas outlet port 508-c). The gas inlet ports 506 may be coupled with one or more gas source lines (e.g., each providing a different gas), while the gas outlet ports 508 may be coupled with an exhaust system. The flow of gas through the gas inlet ports 506 and the gas outlet ports 508 serves to introduce and remove gases (the discharging medium, air, nitrogen, and the like) to and from the discharge chamber 302. Flow of gases through the gas inlet ports 506 and the gas outlet ports 508 is controlled, in some embodiments, by the gas flow control sub-unit.

The discharge chamber 302 is constructed in accordance with various mechanical, electromagnetic (EM) and environmental control requirements. To obtain a high quality processing discharging medium and achieve high quality discharging, the discharge chamber 302 supports a vacuum environment which is typically used before gas filling (see operations 410 and 412, method 400, FIG. 4). The discharge chamber 302 further supports a high pressure environment, in which the discharge chamber 302 is filled with the discharging medium to a high pressure, for use during the polishing processing, and also supports a normal pressure (e.g., 1 atmosphere) dry air (e.g., nitrogen gas) environment for object loading and unloading. A typical gas pressure range for nanosecond fast discharging is in the range of a few atmospheres to tens of atmospheres. In general, shorter discharging pulses utilize a higher pressure of the discharging medium. Therefore, the discharge chamber 302 is designed with mechanical strength and gas sealing specifications that depend upon the designed discharging pulse time. Due to the fact that the MFDP process utilizes repetitive electrical charging and discharging, the discharge chamber 302 provides good electrical performance and insulation, and, in some implementations, also provides electromagnetic shielding and body grounding.

The discharging process inside the discharge chamber 302 can generate strong acoustic noise. Therefore, in some implementations, acoustic noise reduction and shielding are provided.

Because the discharging process will generate heat, even with gas flow, some implementations of the discharge chamber's 302 design include heat exhaust, cooling and temperature control. These elements of the discharge chamber 302 maintain a stable and reliable environment compatible with polishing processes for high-accuracy surface flatness specifications. For example, these elements of the discharge chamber 302 provide an environment in which error sources caused by process deviations, including fluctuations of the gas flow rate, the electrical voltage between the object and electrode array, stage positioning accuracy, temperature and so on, result in errors amounting to a small portion of the surface accuracy and surface flatness specification (e.g., 10%).

Modes of Fast Discharging

Two polishing modes (e.g., modes of controlling polishing) are provided: 1) an active mode of micro fast discharge triggered that is controlled (e.g., triggered) by flatness and/or roughness data resulting from measurements of the surface (e.g., measurements performed prior to the start of polishing using a surface metrology measurement system), and 2) a passive mode (also called self-consistent mode or a self-adapted mode) of micro fast discharge that is triggered by the variation of surface profile. In either case, a preionization signal can be used to facility the trigger of a discharge pulse.

Figures 1, 6:
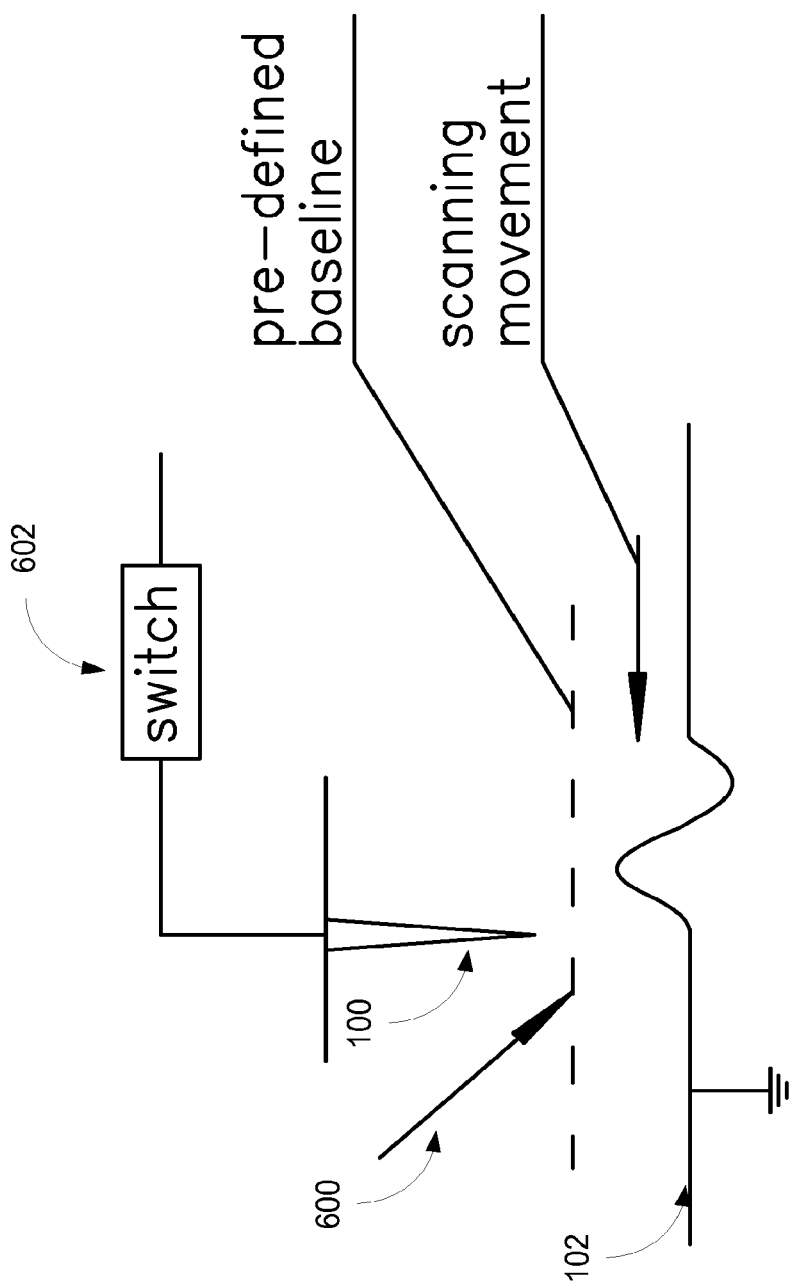
Figures 2, 6:
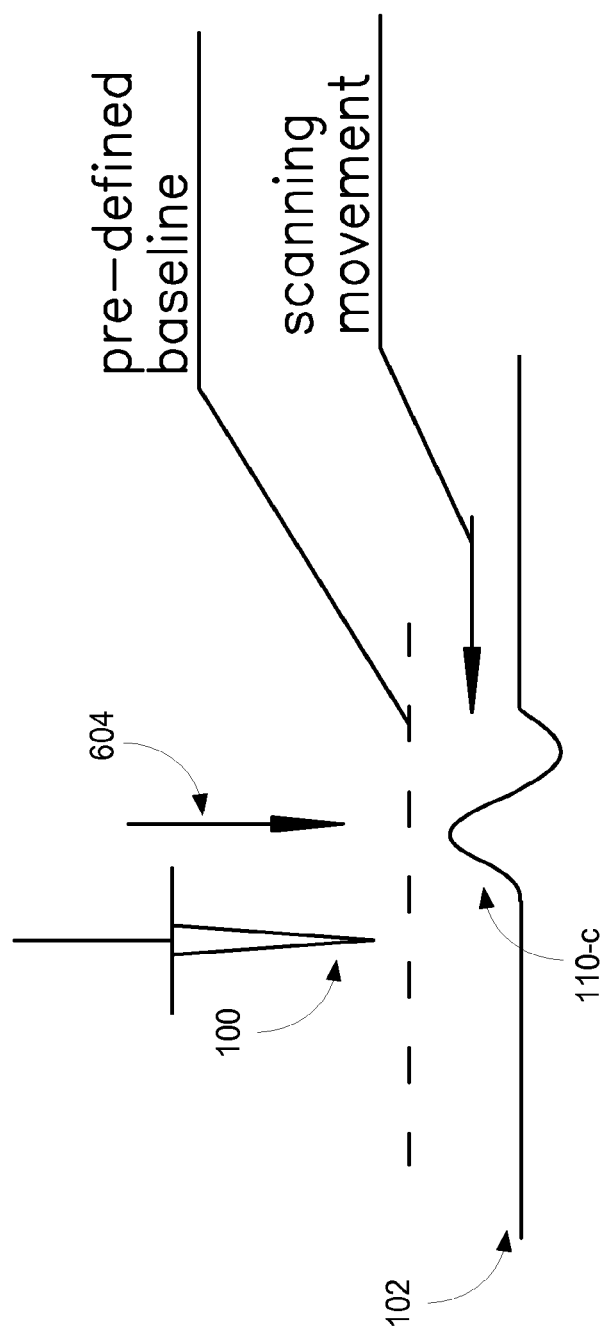
Figures 3, 6:
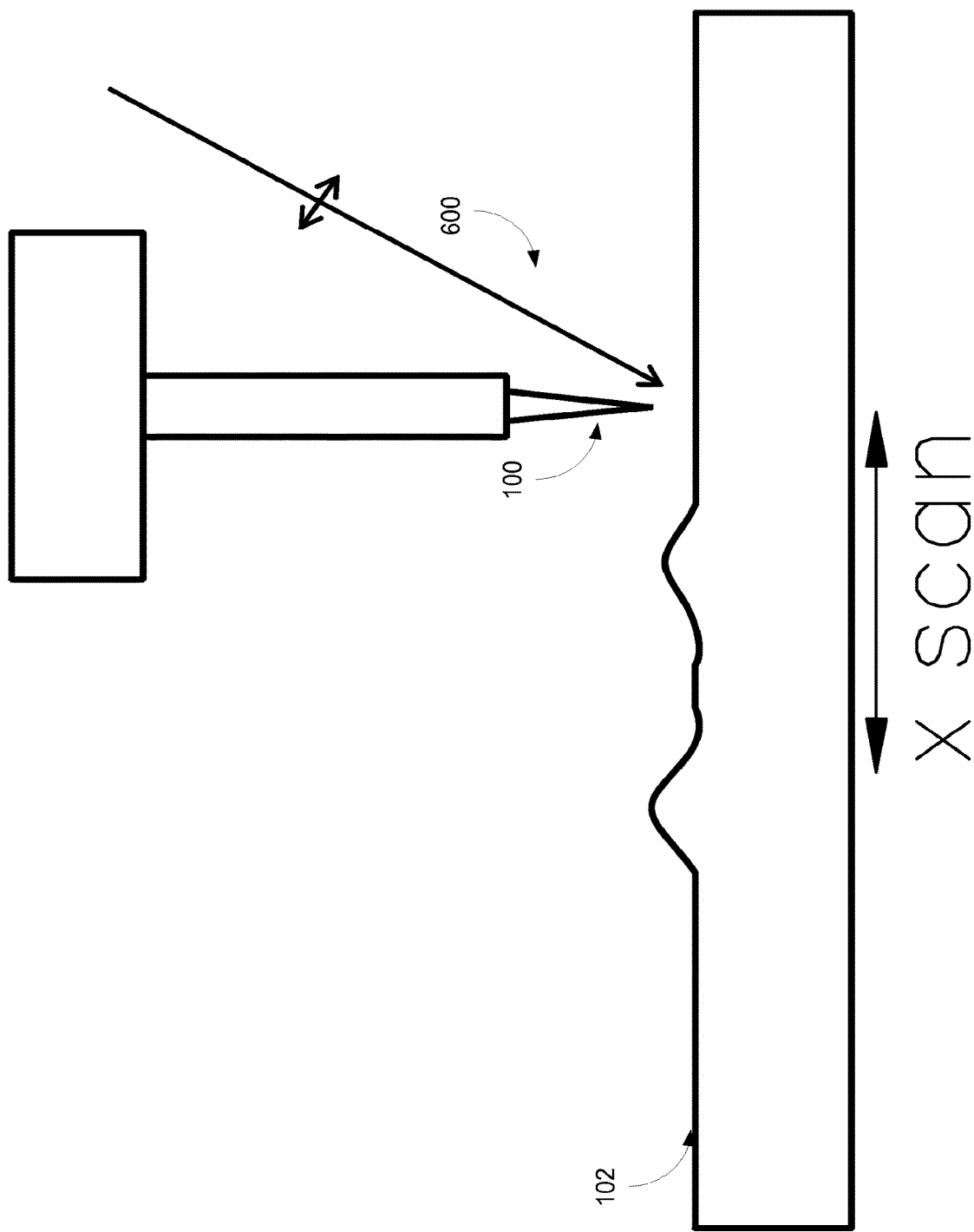

Active Mode:

FIG. 6-1 illustrates the active mode (sometimes called controlled mode) of micro fast discharge polishing (A-MFDP). The fast discharge in this mode is controlled by either flatness metrology data for low to medium spatial frequency surface errors and/or roughness metrology measurement data (e.g. atomic force microscopy data or scanning electron microscopy data), for medium to high spatial frequency surface errors. When the electrode 100 is over a region of the surface 102 that has a corresponding data pixel that exceeds a threshold value, the system sends out a signal to initiate fast discharge and also determines the strength of the discharging electric field using a magnitude of the surface error (e.g. peak-to-valley magnitude). For example, in some implementations, an amount by which a data value exceeds the threshold value is used to determine the strength of the discharging electric field. To this end, a measurement data file is used as an input file and converted into pixel data based on a scanning mechanism (e.g., linear scanning, circular scanning and/or localized scanning). Localized scanning is particularly useful when there are a number of small regions that need polishing. The threshold value of discharging is dependent on various parameters including a user's specification, an incoming surface condition, the discharging medium composition and pressure, and so on. The electrode 100 and the surface 102 to be polished are charged by a fast discharge electrical circuit, in which the electrical voltage between the electrode 100 and the surface 102 is, in some implementations, slightly below the threshold condition (option 1). Alternatively, the electrode and the surface are held at an equal voltage before discharging (option 2). In some implementations, the surface is grounded and a negative electrical voltage is applied to the electrode array.

In option 1, when an imported input pixel shows that a surface parameter at a forthcoming point is above a pre-defined threshold value, a trigger signal 600 is sent out to trigger a pre-ionized weak discharge, which will trigger a main discharge. In this option, the fast discharge is controlled using a switch 602 (e.g., a gas-filled tube or other switch with fast response time). For example, the default position of the switch 602 is an "on" position prior to discharge, but is turned off when the surface discharge is to be ended for pulse duration control. Before a second signal based on the metrology data arrives, the switch 602 is returned to the "on" position, the discharging loop is recharged and the readiness of discharge circuit is restored.

In option 2, the electrode 100 and the surface 102 are held at an equal voltage prior to discharge and a very short high voltage pulse is applied to the discharge loop whenever the switch 602 is turned on, which uses the data from the input file that contains the surface metrology data. Because the discharge cavity is filled to a high pressure with the discharging medium (e.g., helium, or nitrogen, and/or mixture thereof), a fast discharge that is on the order of nanosecond can be achieved. The discharge is a result of breakdown of the discharging medium that can be understood using transmission line theory: when the switch 602 is suddenly turned on, the electromagnetic (EM) field wave is transmitted to the electrode 100. Due to reflection of the EM field wave at the electrode, the electric field between the electrode 100 and the surface 102 is enhanced (e.g., the electric field is doubled or otherwise significantly increased) and therefore forms a sharper discharging pulse. For the active mode, in terms of triggering mechanism, option 2 has an advantage that it is easily implemented. This is sometimes called "Blumlein" type fast discharge.

To reach higher accuracy polishing, this polishing procedure can be repeated. Thus, a result of a current polishing process can serve as a pre-treatment for a subsequent polishing process. However, in some implementations, the discharge conditions and triggering threshold are modified for the subsequent polishing process. In some implementations, the subsequent polishing process is performed in a separate chamber. Alternately, the subsequent polishing process is performed in the same chamber using, for example, a different recipe. In some circumstances, because the nanosecond fast discharge is very powerful, a damage threshold of the surface is determined as part of a process of development and commissioning that can be used to identify the proper discharging parameters. As stated, in both options, in the repetitive discharging process, charging, discharging and switching speeds are designed to be high enough to match the speed of scanning and the pixel density. To this end, the present invention provides an energy reservoir for this purpose, which is described in following section.

Passive Mode:

As shown in FIG. 6-2, passive mode (self-consistent mode) micro fast discharge polishing (P-MFDP) is controlled by variations of the surface topography error (e.g., either non-flatness error or roughness error). Passive micro-fast discharging polishing is sometimes referred to herein as "passive and adaptive fast discharge." The physical principle of this approach is to use the large electric fields around the tip of every hill 110 (e.g., hill 110-c) or sharp surface topography variation, in which the voltage for the discharge is applied between the electrode 100 and the surface 102, to self trigger the discharging pulse. According to discharge physics, a variation of a few percent in the distance between electrode 100 and the surface 102 can cause large electric field variation, ranging from tens of percent increase to double the original value. When the voltage between the electrode 100 and the surface 102 is set slightly below the breakdown voltage, this strong electric field variation will suddenly trigger the discharge. Because the electrode tip can be made as small as hundreds of nanometers and the discharge distance can be controlled at the sub-micrometer level, this approach can perform high accuracy polishing, ranging from the micrometer to the nanometer level, depending on the original surface flatness and roughness level and the quality of the electrode 100 and/or electrode array as well as the accuracy the stage leveling and control of the stage movement.

In some implementations, the electrode 100 and the surface 102 are charged to their relative voltage by a capacitor circuit with low electrical inductance. In some implementations, the circuit includes a discharge termination switch (analogous to the switch 602 in FIG. 6-1) that is in a default "on" position when no discharge occurs. The discharge termination switch is turned off very quickly when discharge occurs and a feedback signal from a sensor (detector) in the discharge loop is sent back to this switch to terminate the discharge, which is the option 1 triggering mechanism stated in previous section. In some implementations, the switch is a "discharge type" switch that fills with a high pressure gas (helium or nitrogen and/or a mixture thereof) to increase the switching speed. At a few atmosphere pressures, the switching speed can be controlled at the nanosecond level so that very short pulse discharges can be realized. After discharge is terminated, the switch is placed back into the default "on" position and the loop begins the recharging process. This procedure will occur again whenever the electrode 100 encounters a sharp hill 110 in the surface topography during the scanning, which triggers another fast discharge event. The scanning path in this scheme can be one of several options (e.g., circular scanning, x-y scanning and/or localized scanning), depending on the dimensional shape of object and condition of surface error distribution. The passive mode can also utilize the option 2 triggering mechanism, in which both sides of the discharge cavity are held at the same voltage prior to discharge and a default "off" switch turns on to begin the discharge process. When the discharge ends, the switch returns to the "off" position. In the option 2 configuration, the triggering signal is from the variation of surface topography, which can be measured and given by for example, a height sensor 604.

Material and Conductivity

The effectiveness of the fast discharge polishing process is increased if the material to be polished has a high electrical conductivity. For semiconductors or low conductivity materials such as insulators, the fast discharge situation is different compared to fast discharge using conductive materials, and therefore different process parameters are used. Namely, the difference of material conductivity will dictate a different discharging threshold and pulse profile, and therefore other technical methods may be implemented to improve the discharging effectiveness and smoothness. For example, different process recipes are defined with different discharge parameters for different materials. In addition (or alternatively), a coating of a conductive film (e.g., with a thickness of a few nanometers to tens of nanometers), can be applied to the surface 102 to increase the effective conductivity for the polishing process and then removed (e.g., by sputtering) after polishing process ends. As another example, a thin film of purified water, with appropriately conductive additions, spin coated on the surface can be used and subsequently cleaned and/or evaporated after the polishing process. When the surface 102 has a complex pattern or mixture of different materials (e.g., a patterned semiconductor wafer surface), pattern data and material parameters including conductivity distribution can be integrated into a data preparation file in the active mode and the discharge conditions can be pre-set accordingly (e.g., timing of preionization, discharging pulse duration and discharge cut-off time, and so on). Alternately, or in addition to, the process can be simplified by use of an assisting coating applied on surface 102.

Scanning Mechanisms

There are multiple options for relative scanning mechanism between an electrode 100 or electrode array (1-dimensional or 2-dimensional) and object 103 mounted on the stage. In some implementations, the electrode array only moves in the z-direction and the object 103 is mounted on a stage that provides x-y movement (e.g., either translational or rotational or localized movement).

FIG. 9 illustrates multiple "needle-type" electrodes comprising a 1-dimensional (1-D) array. Each "needle-type" electrode 100 in the array (e.g., electrodes 100-a through 100-n) can be adjusted independently so as to avoid contact with the surface due to the surface flatness variations. The 1-D electrode array can be designed in multiple ways. For example, (1) the distance (or ratio of the distance) between neighboring electrodes 100 is one of prime numbers or non-integer numbers so that scanning paths will be interlaced but not overlapping, or (2) the distance between neighboring electrodes 100 is a constant first distance, where the constant first distance is smaller than the minimum pixel size provided by surface metrology data (to increase a discharge striking density to meet polishing requirements, which may be useful if the dimensional size of object is big and metrology data pixel size is also big), or 3) the distance between neighboring electrodes 100 is a predefined second constant distance, where the minimum pixel size is smaller than the predefined second constant distance. The latter arrangement is used in conjunction with a stepping movement after each scanning path that steps a fraction of the distance between electrodes within the electrode array, so that the entire region surface is covered.

These options are provided only as examples to aide in a more thorough understanding of the present invention, and are not intended to limit the claims that follow. Moreover, any combination of scanning mechanisms, stepping movements and electrode array arrangements that minimizes multiple fast discharging events at same location and missed spot may be used, as well as others.

Electrodes 100 can also be arranged in 2-D array to increase throughput (e.g., reduce the time) of the polishing process. In a 2-D array, different rows of electrodes 100 can be shifted in position relative to a neighboring row (e.g., assuming all of rows have the same distance between electrodes). For example, in a three row array (having a first row, a second row, and a third row, each with rows of electrodes 100 placed along a row direction), the second row of electrodes 100 can be shifted relative to the first row along the row direction one third of the distance between neighboring electrodes 100, and the third row can be shifted along the row direction an additional one third of the distance relative to second row. When the minimum pixel size of the metrology data is much smaller than distance between electrodes 100, this approach will cover more locations on the surface in each cycle and effectively reduce the polishing time. In a situation in which the minimum pixel size is large compared with the distance between two electrodes 100, this approach can also reduce the effective polishing area and increase the overall quality of surface polishing.

Movement of the Object

Figures 1, 10:
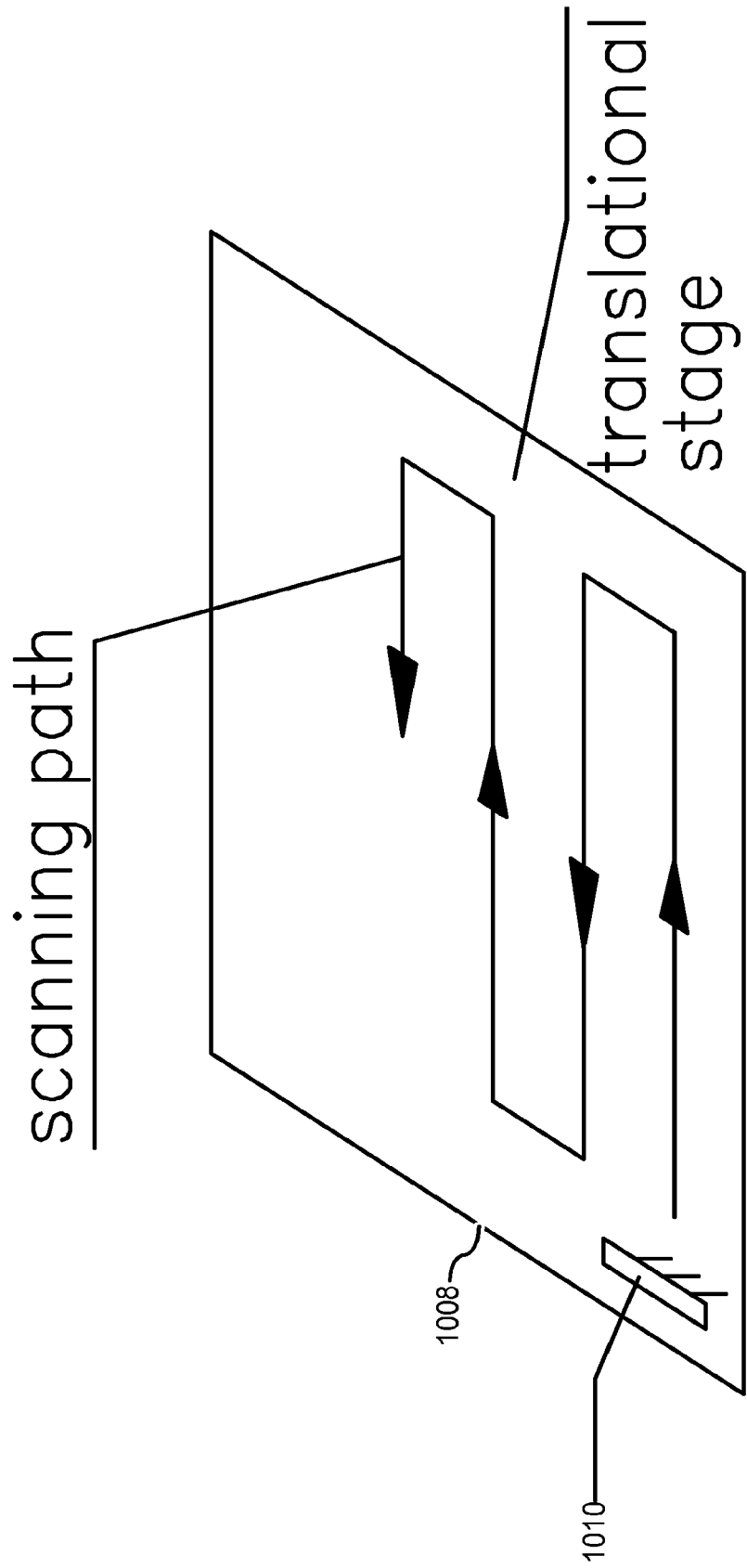
Figures 2, 10:
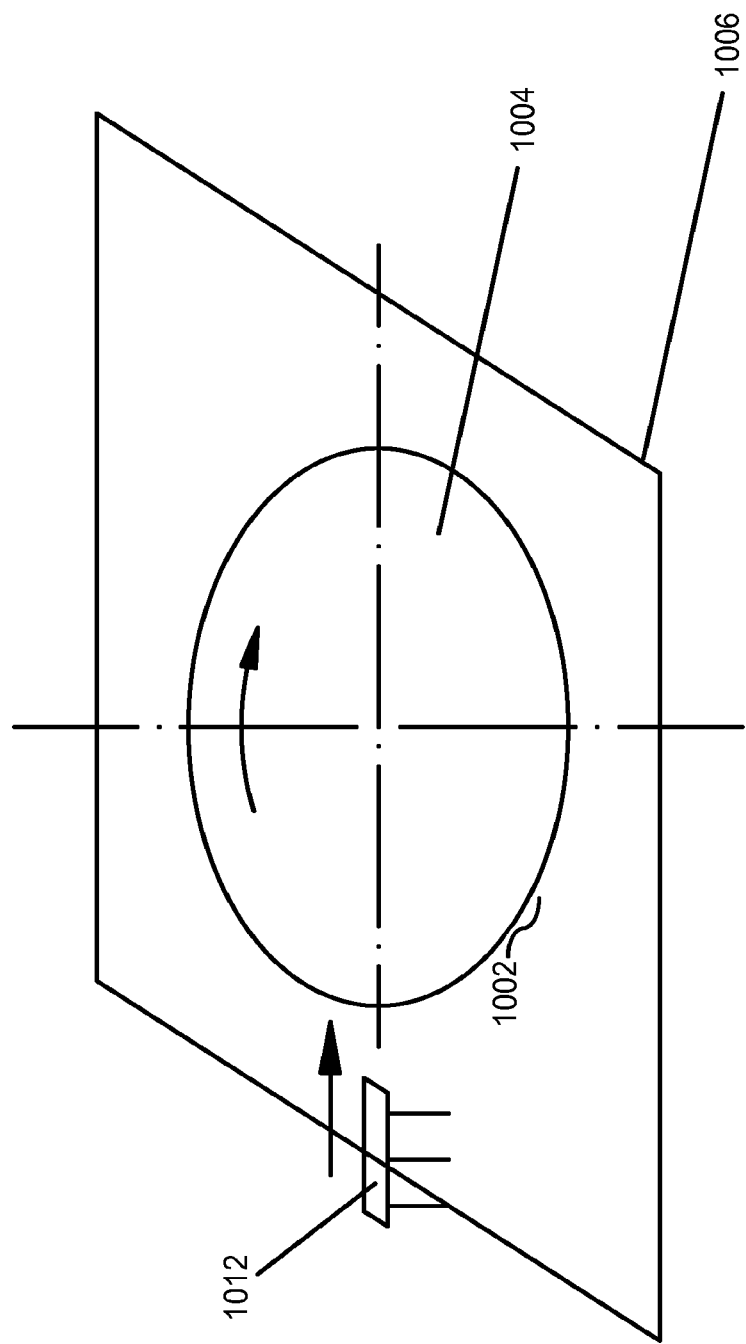

As shown in FIG. 10-2, in some implementations, an object 1002 rotates around a central axis (parallel to the z-axis) via a rotational stage 1004 while a translational stage 1006 simultaneously performs translational movement in a pre-defined direction such that the electrode head passes over a center of the object 103. This option is appropriate for objects 1002 with a circular shape (e.g., a semiconductor wafer). Different ratios of rotational and translational rates can define a scanning path of an electrode array 1012 relative to the surface and determine fineness of surface treatment. When an active polishing mode is used, this ratio is aligned with the pixel size of metrology data. In addition, the translational movement of the stage can be continuous or stepped and therefore defines the final scanning trajectory of the object 1002. In some implementations, the design of electrode array 1010/1012 is such that the trajectory from each electrode will not overlap with the trajectory from any other electrode.

As shown in FIG. 10-1, for an object 1008 with a square or rectangle shape, the movement of the object 1008 is similar to that used in a typical linear scanning system. In this configuration, a 2-dimensional electrode array 1010 is easier to implement, compared with other configurations.

If the object 1002/1008 has isolated regions (e.g., sparse regions) that need surface polishing, localized scanning is useful. In this mechanism, the object on the stage moves to the localized regions in a pre-defined order and performs the polishing.

Electrode and Electrode Array Design

There are many potential materials suitable for "needle-type" electrodes, including: tungsten, copper, molybdenum, zirconium, tantalum, and/or combinations and alloys thereof. Other materials or alloys are also possible. To sustain a stable and durable manufacturing process for high volume manufacturing, the material is chosen such that the electrode is sufficiently capable of resisting electrical wear so as to withstand the high repetition rate of the discharging pulses and the accompanying heat generation. In some implementations, a side surface of the electrode (e.g., to which the "needle-type" electrode tip is attached) is polished to a high degree of smoothness to avoid sharp tips and/or valley. In some implementations, the shape of the electrode tip is a spherical or an otherwise smooth shape, rather than an acute angle. This is to avoid damage of the electrode tip via "explosion" discharge around the acute angle.

In some implementations, to increase the polishing process throughput and improve efficiency, multiple "needle-type" electrodes can be arranged into a 1-dimensional array or 2-dimensional array. In some implementations, all of the electrodes are identical and mutually exchangeable. In some implementations, the shape of each identical electrode tip is near "needle-type," characterized by a non-acute angle (e.g., the electrode tip is characterized by an angle of 30 degrees with a spherical radius of curvature at the tip of 100-500 nanometers). According to the theory of gas discharge, the shape of the electrode tip influences the uniformity, stability, and shape of the discharging pulse. When the electrode tip is sharp, electrons in the discharging pulse have divergent angle so that the bombardment area on surface is spread out. Because the MFDP system works in a high gas pressure environment, maintaining a stable and slightly higher temperature on the electrode array than in neighboring regions is helpful in terms of keeping the electrode clean and eliminating contamination generated from the discharging pulse.

In some implementations, the distance between electrodes is a constant. Alternatively, the distance between electrodes is different between differing pairs of neighboring electrodes. In some implementations, the distance between electrodes is a first constant distance in one direction (e.g., the x-direction), and a second constant distance in a different direction (e.g., the y-direction), depending on, for example, the scanning mechanism design and object.

In some circumstances, it is suitable to individually control every electrode of an electrode array. This is because each electrode will be exposed to a different region of the surface with different metrology data and therefore will be subject to a different discharge condition.

Library of Electrodes

Figures 1, 14:
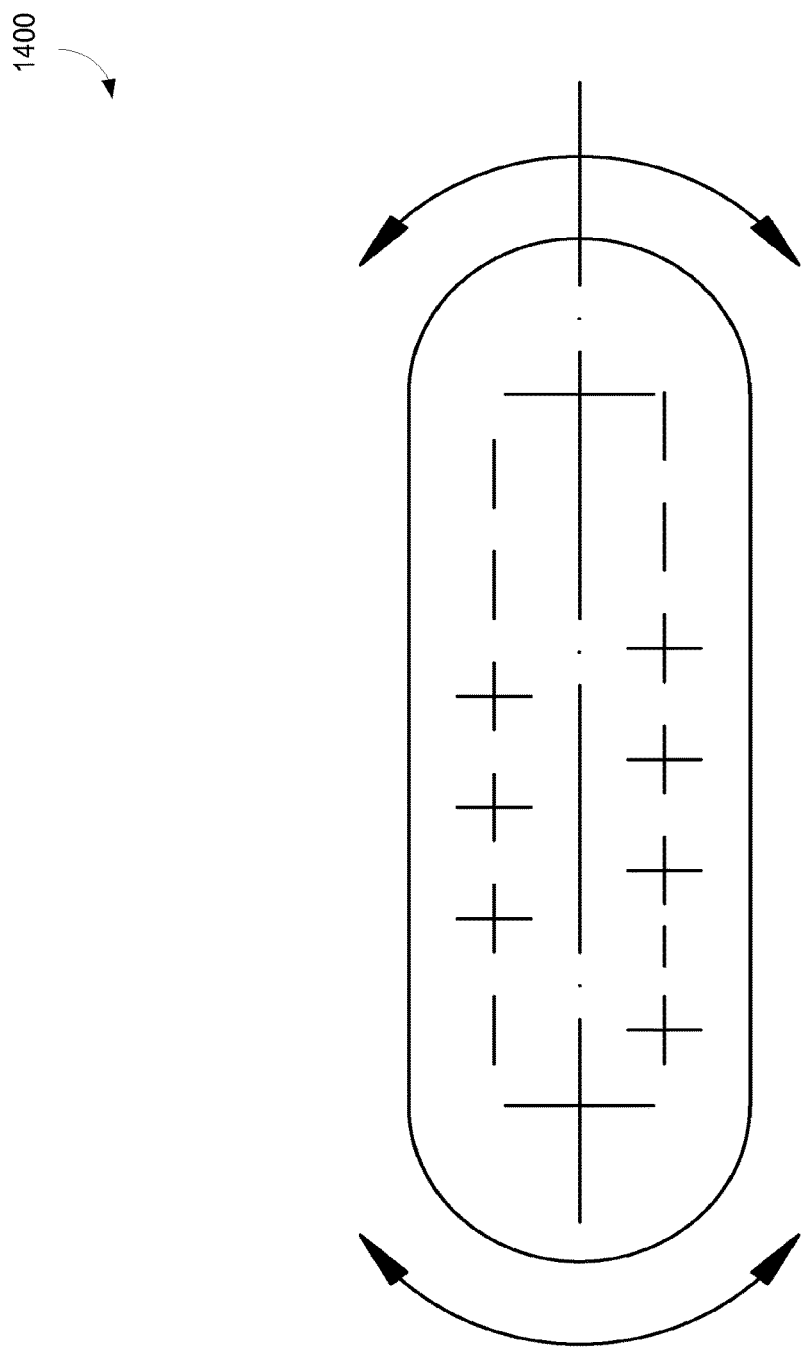
Figures 2, 14:
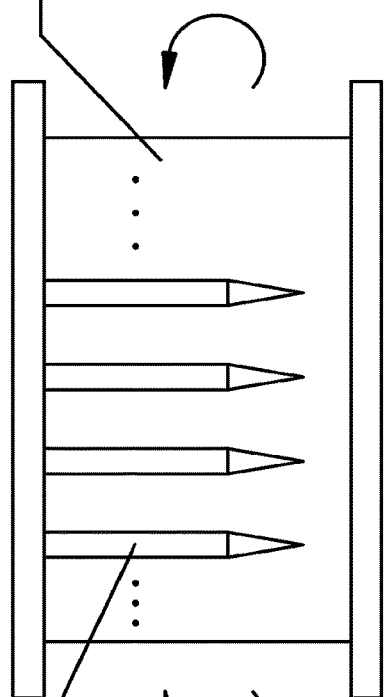

In some implementations, the MFDP process is a high repetition rate discharging process. The high repetition rate helps to meet high volume manufacturing throughput demand. The repetition rate of the discharging process can be from a few kilohertz (kHz) to tens of kilohertz and each discharge involves a short and intense release of energy from an electrode tip. This may bring degradation or damage to the electrode tip and therefore reduce the surface polishing quality and/or cause system interruptions (e.g., system down time). Besides selection of an appropriate electrode material that can strengthen the electrode, real-time monitoring and adjustment of the electrode in the z-direction helps to mitigation these issues. When an electrode is damaged or its shape is changed so as to render it non-functional, or otherwise reaches criteria whereby the electrode cannot be further adjusted, a replacement of the electrode is performed. To improve system efficiency and reduce system down time, a library of electrode arrays inside the main discharge chamber is provided in some implementations to allow the system to quickly replace damaged electrodes and resume normal processes. FIG. 14 shows an example of an electrode library design (FIG. 14-1 is a top view of the electrode library 1400 and FIG. 14-2 is a side view of the electrode library 1400). In the example electrode library design, all of the electrodes 100 are identical and ready-touse. Furthermore, the electrodes 100 are arranged in a chain connected format. Each electrode 100 can be inserted into a chain or taken out by a robot. In some implementations, the position for electrode replacement is fixed for convenience, but other options are possible. After an electrode 100 is replaced, the chain moves (e.g., using a library rotator 1402) and makes the next new electrode 100 available at the replacement position. The status of the electrode library is recorded and shown in real-time and the library of electrodes can be replaced when no remaining electrodes 100 exists in it. Using this approach, a user does not have to place the system into a "down-state" for a single electrode replacement. This is useful because placing the system into a "down-state," and more specifically bringing the system out of a "down-state" may, in some circumstances, involve complicated and time consuming operations, including vacuuming, air-balancing, part replacement, high pressure gas re-filling, system balancing and re-calibration, and the like.

Calibration Panels and Adjustment

As shown in FIG. 11, in some implementations, outside of the polishing area 1100 and on the stage, there are one or more calibration panels 1102 (e.g., calibration panel 1102-1 and calibration panel 1102-2), which serve as a reference plane and surface standard. In some implementations, there are multiple levels of calibration for the polishing process. The calibration panels 1102 are manufactured with a sufficiently high surface accuracy to meet the high accuracy polishing specification (e.g., the calibration panel will have three times higher accuracy, in terms of peak-valley error, than the polishing specification). During calibration, a minimum allowable discharge distance (or gap) between the electrode tip and the surface is established. For example, the minimum allowable discharge distance is set to a number in the range of 2-4 times a characteristic peak-valley error of the surface. In some circumstances, the calibrations panels 1102 are calibrated and leveled before the system begins processing and calibrated again whenever system is down for maintenance or repair work. In some implementations, the calibration is performed using a probe (e.g., an atomic force microscope or scanning electron microscope) to produce a height map of the calibration panel 1102 and characterize a tilt angle so that necessary adjustments can be made. After the system is calibrated, the object is calibrated and/or adjusted with reference to the calibration panels 1102. The calibration is performed using points of a predefined grid on the surface 102 and, using this calibration, the system determines the reference or "z=0" plane of the surface 102, by using either metrology data or an average value of a grid measurement. In some implementations, before the polishing process begins, the electrode array 1010/1012 is calibrated against the calibration panels 1102 to assure that all of the electrodes 100 in the electrode array 1010/1012 are at a pre-determined height referenced to the "z=0" plane. In some implementations, the surface 102 is divided into scanning paths, which can be bands for square region or zones for circular region. In some implementations, the calibration is repeated after each scanning path is scanned, and the electrode tip is adjusted with reference to the reference plane. For high accuracy polishing, real-time monitoring and adjustment can be performed during the process by moving the electrode array 1010/1012 back to the calibration panels, measuring the variation of the electrode tip height, and compensating for the change. In addition, the discharging pulses will generate heat and acoustic waves that can trigger chemical reactions near the tip of the electrode, which may wear or even damage the tip of electrode 100. For at least these reasons, the electrode tip height is adjustable in the z-direction.

Energy Reservoirs for Charging and Discharging

In order to allow the system to continuously run the polishing process with high stability and precision, some implementations provide an energy reservoir to store electrical energy. Due to the fast throughput of objects through the process in a production environment, the system generally maintains a high scanning speed of the stage and/or a high repetition rate of discharging pulses. This helps to guarantee continuous operation without missing regions that need to be processed. To maintain the high speed of the scanning stage and/or the high repetition rate of the discharging pulses with stable energy release, the stored electrical energy has a corresponding stable energy level throughout whole process. A conventional energy reservoir will have difficulty meeting these requirements, especially when a large electrode array is utilized.

Figure 13:
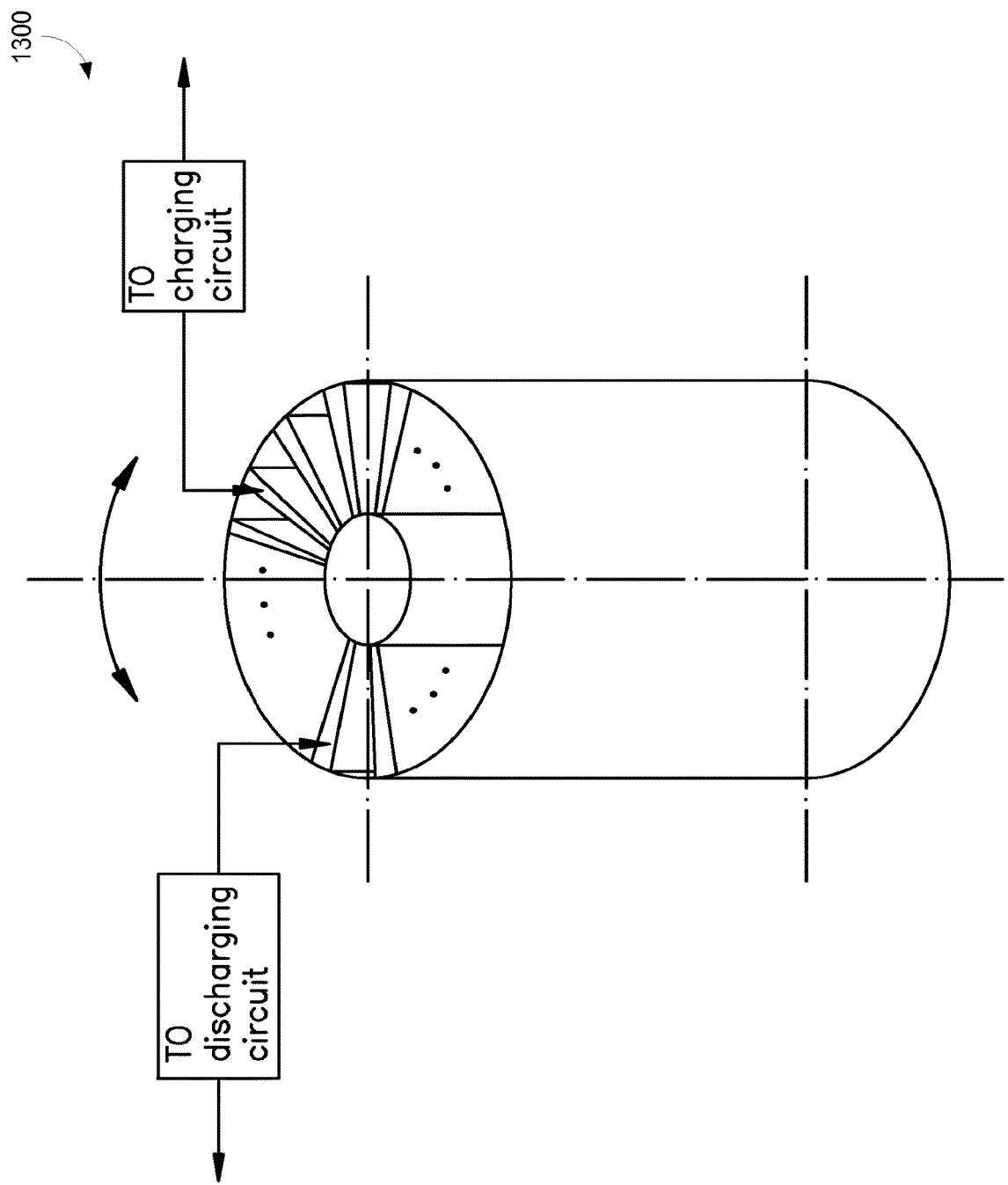
FIG. 13 illustrates an electrical energy reservoir that contains multiple electrical charging and discharging sub-units, in accordance with some implementations.

To that end, the present invention provides a novel type of energy reservoir. In some implementations, the energy reservoir has a cylindrically symmetric structure 1300, as shown in FIG. 13. In some implementations, the energy reservoir has a structure that is characterized by another symmetry type (e.g., other than cylindrical). The energy reservoir is divided into a plurality of capacitor units and each unit can independently support the entire electrode array. In some implementations, each capacitor unit contains a plurality of electrical capacitors for energy storage and each capacitor can independently support a single electrode in the electrode array. While one capacitor unit is connected with the electrode array for discharging, the rest of the capacitor units can be undergoing a charging process. When the charging speed in a respective capacitor unit that is connected to the electrode array is insufficient to keep pace with a polishing scan (e.g., because of a low amount of charge on one or more capacitors in the capacitor unit), the system can switch to a different, fully charged, capacitor unit to continuing processing. As a general principle, if the respective capacitor unit can support a kilohertz or higher repetition rate of discharging pulses, the other capacitor unit will remain idle with full charge.

Electrical Circuitry for Fast Discharging

Electrical circuitry and switching for the purposes of igniting and sustaining electrical discharge from a capacitor and supporting the re-charging thereof is a mature technology which has been utilized in various fields (e.g., high voltage short electrical current pulse generation, accelerator technology, Blumlein circuitry utilized in excimer lasers, and so on). In principle, such circuitry uses capacitors to store high voltage electrical energy and further utilizes a fast triggering mechanism and circuitry with low inductance to realize fast discharging. Conventional Blumlein fast discharge circuitry utilizes a discharge controlling switch. The discharge controlling switch is maintained in an "off" position and both electrodes are held at an equal electrical potential through an inductance connection while a charging loop is charged to a high electrical voltage. A high pressure gas mixture inside the discharge chamber (and, therefore, between electrodes) increases the breakdown voltage of the discharge cavity and thus steepens the shape and shortens the pulse-width of a resultant discharging pulse. Several circuitry designs or configurations that can generate the fast discharge are known in the art. However, in terms of the discharge process, one difference between the present invention and past applications is that, in the present invention, it is desirable to avoid energy excitation or an unwanted energy loss mechanism inside the discharging medium.

Therefore, gas species which have the potential to induce excitation/emission or inelastic energy loss should be avoided so that the majority of electrical discharge energy transfer can occur between the electrode and the surface.

In present invention, the polishing strength results from an electric field with an electric field strength, E, which could be in range of $10^4$-$10^6$ V/cm or even higher. In some implementations, the distance between electrode and surface is quite small, so the charging voltage does not necessarily have to be very high (a range of $10^2$-$10^3$ volts is enough for some practical processes). In some implementations, the fast discharge process utilizes a high voltage but low electrical current. To this end, the electric field strength, E, is controlled below $10^6$ V/cm (in some circumstances, electric field strengths near or above a $10^8$ V/cm level may generate a large electrical current, which could damage the surface).

Preionization and Discharging Performance

The fast discharging process involves electrical breakdown and utilizes a steep rise of a discharging pulse. Adding a preionization process before the discharge can smooth the electric field formed in the discharge cavity during a discharging pulse (e.g., reduce the divergence of the electric field at various points in the discharge cavity). Consequently, the preionization process serves to ease the electrical breakdown and gain controllability of discharging pulses. In the past, there have been various types of preionization processes (e.g. in excimer lasers). In the present invention, a UV source lamp (or short wavelength diode laser array) and micro-lens array can be utilized as source of preionization. In some implementations, lamp light is split into multiple beams and each beam passes through a transporting fiber and is focused by a micro-lens into the discharge cavity, near the tip of an electrode, shown in FIG. 6-3. In the case of a diode laser array, a laser diode and micro-lens can have one-to-one arrangement. A weak electron beam generated by the preionization process plays a role in the formation and development of the discharging pulse and can contribute to shape of discharge path and the duration and rising time of the discharging pulse. Therefore, the timing between preionization and the rising edge of the discharging pulse and the duration and strength of preionization pulse can be developed as part of a polishing process recipe. These values therefore comprise tuning parameters that a user can use to enhance the flexibility, quality and capability of polishing process.

Layout of Multiple Discharge Chambers

Figure 7:
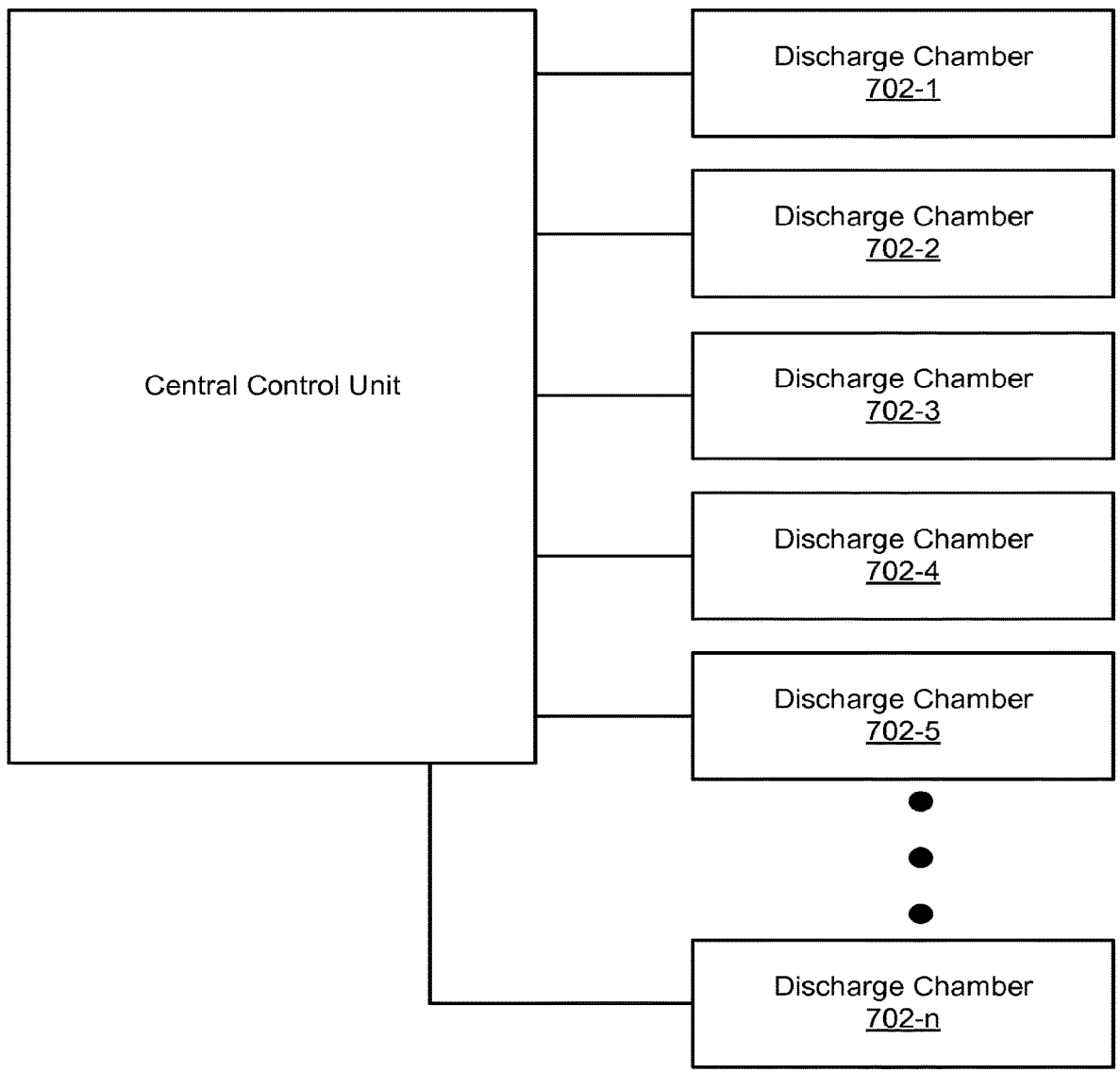
FIG. 7 is a schematic diagram illustrating multiple MFDP system integrated into a single system with a common control center, in accordance with some implementations.

In some implementations, a plurality of discharge chambers 702 (e.g., discharge chamber 702-1, 702-2, 702-3, 702-4, and 702-5) are integrated into a single MFDP system, as shown in FIG. 7. The plurality of discharge chambers 702, which each include an electrode head and stage, can be identical (e.g., for parallel processing of objects with the same specifications), or can be different (e.g., for serial processing of an object where each chamber is tuned to a different set of specifications, for example, to polish a different material or use different discharge parameters and/or different processing condition). To increase throughput in a manufacturing environment, this method provides enhanced capacity for parallel polishing processes and flexibility for different applications and process flows. Multiple chambers 702 can be operated by a centralized control unit or by individual units. The objects can be stored in single storage unit or separate units, depending on the specifics of the application. In the case of the identical process chambers for treatment of objects with similar incoming surface quality and the same (or similar) specifications on surface accuracy, a large quantity output can be achieved by utilizing a single storage space and central control unit with high level automation.

Multiple MFDP Systems in Series

Figure 8:
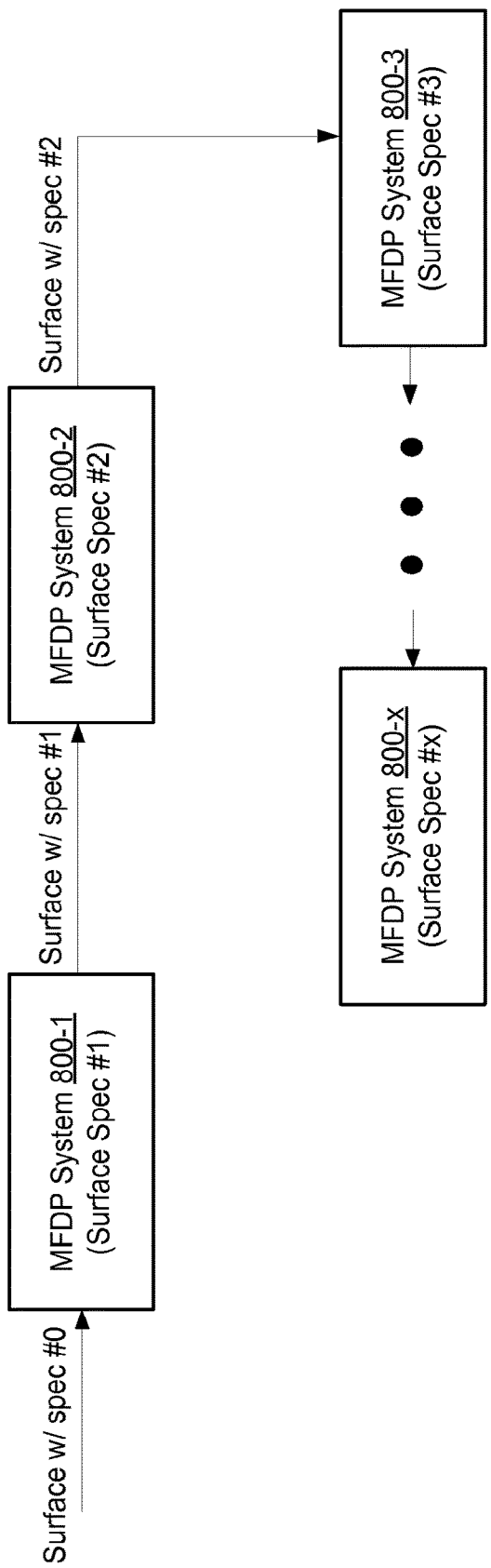
FIG. 8 illustrates a process of using a plurality of MFDP systems in series with different polishing specifications, in accordance with some implementations.

The minimum allowable discharging distance (or gap) between the electrode tip and the reference plane (or z=0 plane) of the surface is determined based on a surface accuracy as measured by a maximum peak-valley (P-V) error of surface. There is a maximum capability for a single polishing process that is tied to the incoming surface accuracy. To achieve a high surface accuracy on a surface with an initially low surface accuracy (e.g., prior to polishing), a sequential polishing process is appropriate, in which the output object of a first MFDP system becomes the input object of a second MFDP system. The same approach follows if there are more than two systems in series. For example, as shown in FIG. 8, an object with a surface having an initial specification labeled "spec #0," is polished by an MFDP system 800-1 to a surface spec labeled "spec #1." The object, now polished to spec #1, is then passed to an MFDP system 800-2 to a surface spec labeled "spec #2." The process proceeds in an analogous manner through MFDP systems 800-3 through 800-x (which can include an arbitrary number of MFDP systems).

It is appropriate to set a polishing ratio for a single MFDP system (a polishing ratio as used herein means the ratio of an output surface accuracy and to an input surface accuracy). As an example, one can use a maximum P-V value as the measureable quantity for surface accuracy and set the ratio in the range of 25%-40% . As another example, a 30% ratio can be used as a starting point for process engineering and equipment development. Use of a fixed polishing ratio is advantageous for object alignment and electrode tip calibration and for reducing the risk of electrode damage or degradation of the electrode shape around the sharp tip.

Discharging Medium Cycling and Filtering

Figure 12:
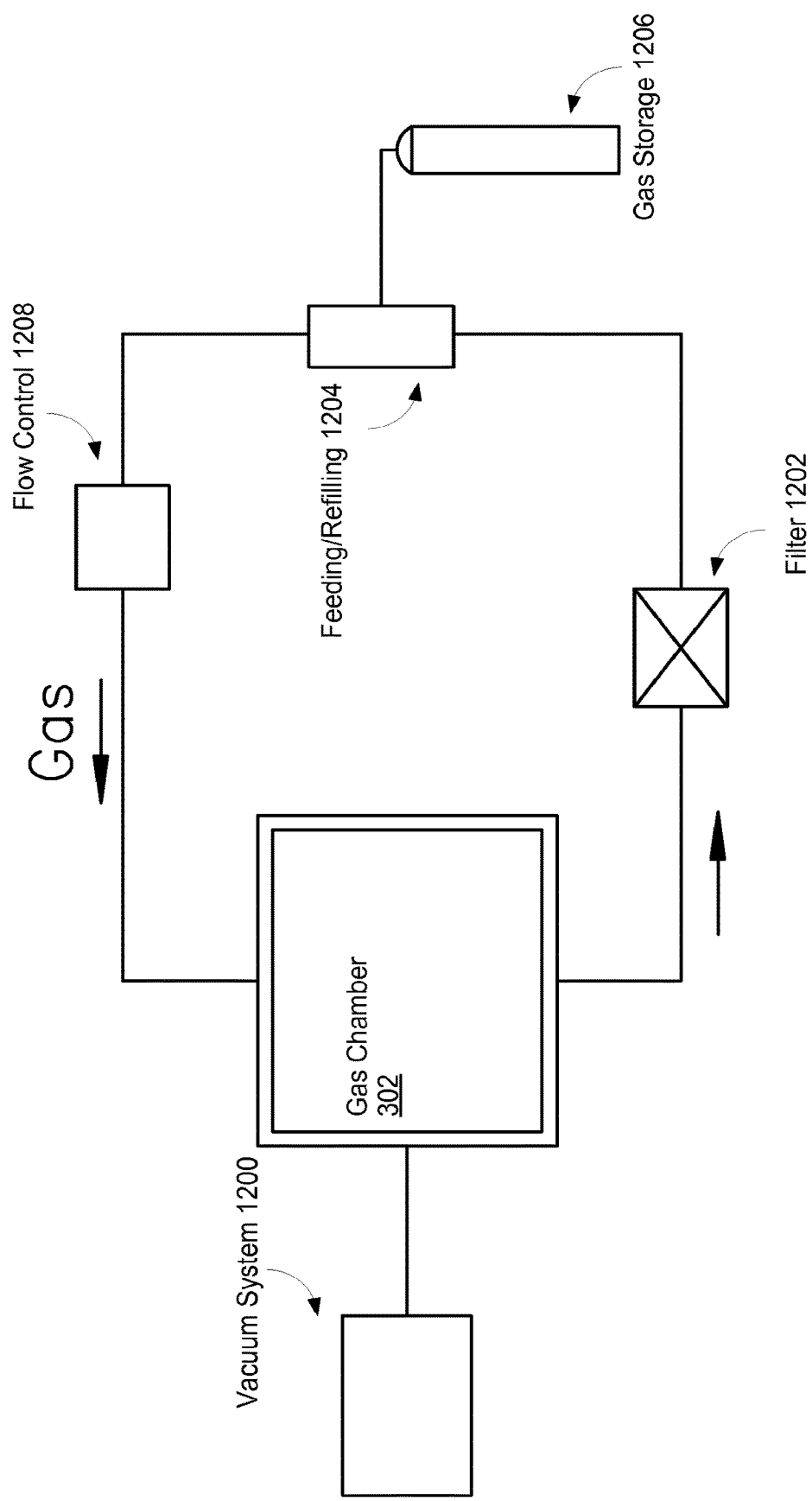
FIG. 12 is a flow diagram illustrating a gas medium flowing loop, in accordance with some implementations.

FIG. 12 shows a processing gas flowing loop. The loop includes the gas chamber 302, a vacuum system 1200 for providing vacuum conditions and removing gases from the gas chamber 302, a filter 1202 for cleaning gases for reuse, a feeding/refilling unit 1204 that provides coupling between the various gas lines and a gas storage system 1206, and a flow control 1208 for controlling gas flow into the gas chamber 302. The restoration time of the discharging medium after a discharging pulse is in range of nanosecond to tens of nanoseconds, which is sufficient to support kilohertz or higher discharge repetition rates. However, during the process, the discharging mixture can be contaminated. To improve the quality of the discharging pulses and remove contamination inside the discharging medium, cycling and filtering is performed in accordance with some implementations. Moreover, in some implementations, usage of the discharging medium through cycling can last a long time without re-filling because the discharging medium is stable. In the polishing process, the discharging medium plays a role for breakdown threshold control and the transfer of electrical energy to the surface. Thus, some gases, especially those with lower excitation energy levels, should be avoided. The gas flowing direction should be chosen to minimize vibrations of the electrode and/or the electrode array, as well as minimize force on electrodes.

Remaining Charge on the Surface after Polishing

Due to the nature of micro-fast discharging polishing, some electrical charge may remain on the surface after the polishing process, even if the object is grounded before and during the polishing process. To remove the residual electrical charge from the surface, according to some implementations, there is a buffering period after polishing, during which the object is grounded for a certain period of time.

While the electric field strength, E, is extremely strong between the electrode tip and the surface during discharging, the voltage applied between the electrode and the surface is typically in the range of hundreds of volts because the discharge distance between the electrode tip and the surface is quite small (e.g., in the range of sub-millimeters or tens of micrometers or even smaller). Therefore, the voltage due to remnant charge on surface after discharge polishing is well under a thousand volts, which is the critical threshold for electrostatic triggered surface damage, although the remaining voltage on surface needs to be eliminated.

Post-processing

The fast discharge polishing process will crash surface "hills" and generate debris. While some debris is removed by flowing of the discharging medium, some debris may remain on the surface, and therefore needs to be removed. Meanwhile, the discharge process may cause some electrical charge to accumulate on the surface even though the object is grounded during processing, which will create unwanted effects on the polished object and impact the subsequent process steps. These issues plus others, e.g. non-uniform heat accumulation or stress distribution, are dealt with in post-processing. After the polishing process is done and the object is moved out of the chamber, it can be transferred to a separated unit for post-processing, before it returns to the object storage library. Debris clean-up can be done using pressurized dry air flow at a grazing incidence relative to the surface. To remove residual electrical charge from polished surface, one can reverse the polarity of electrical connection. In this case, the object is still grounded but a pad with positive electrical polarity touches an edge or outer area of the object.

Also, optionally, during post-processing, is an operation to release surface stress. For high accuracy surface polishing at sub-micrometer or nanometer levels, any remaining surface stress accumulated from the polishing process or non-uniform heating generated by the discharge polishing process may induce surface distortions and therefore impact the final quality of the fast discharge polishing. To reduce or eliminate remaining stress, the object can be warmed up for a certain period of time and then gradually cooled down. This post-processing is similar to those familiar processes for material heat treatment or annealing, and this step can release both surface stress and non-uniform heat accumulation across surface.

Environmental Controls

Several environmental controls are provided that achieve various tasks, optionally including: electromagnetic field shielding and grounding, temperature controls, vibration isolation, and acoustic noise isolation. All of requirements for environmental control of the MFDP system, except acoustic noise isolation, should be similar to those of a typical optical or e-beam imaging/lithography system or other sophisticated process equipment. The acoustic noise control is to shield the noise generated by high repetitive discharging process so that is will not interfere with the neighboring equipment.

Methods of Surface Polishing

Figures 2, 15:
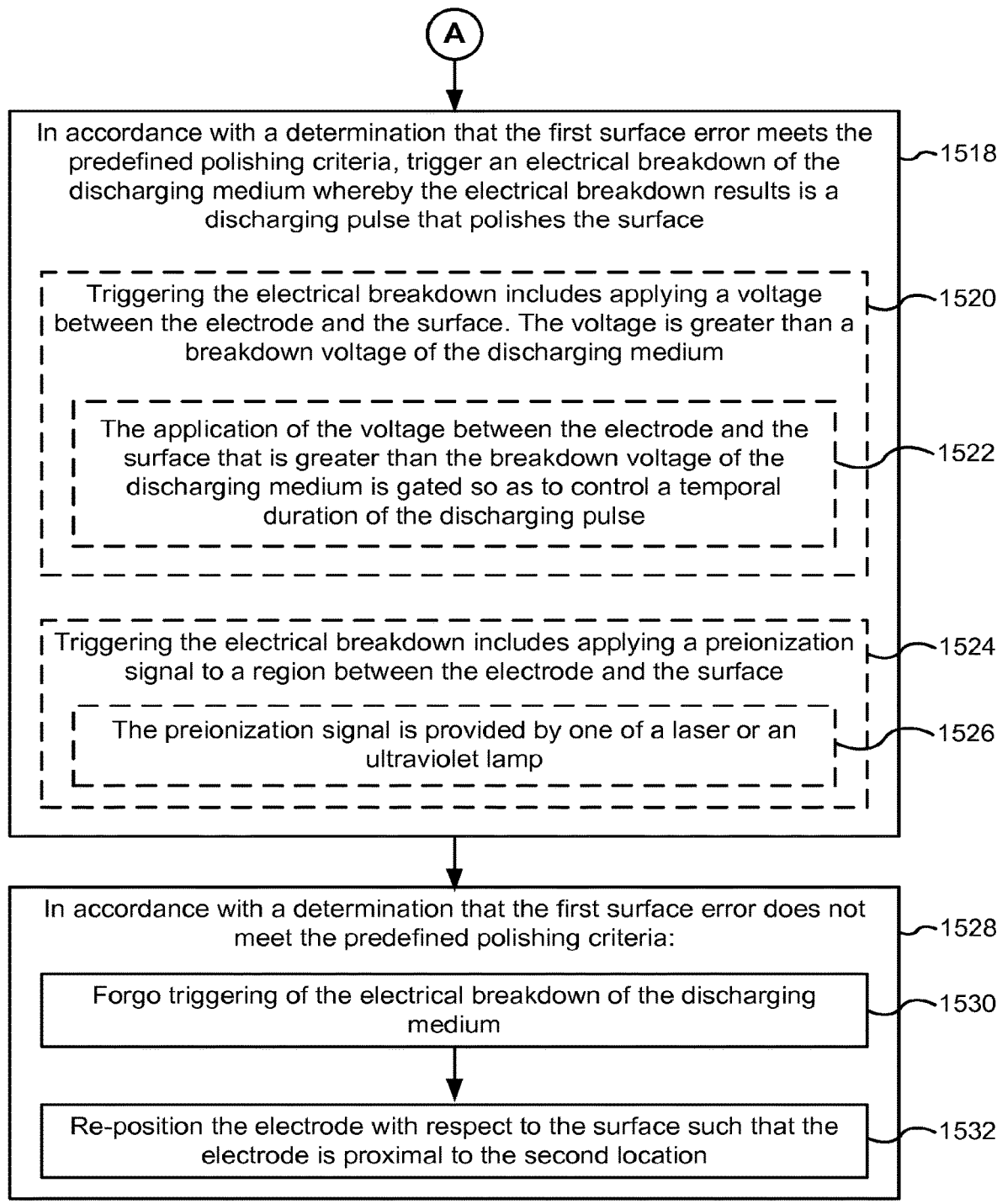

FIGS. 15-1 and 15-2 are flow diagrams illustrating a method 1500 of polishing a surface, in accordance with some implementations.

The method 1500 includes generating (1502) a pixel map of a surface. The pixel map includes a plurality of pixels including a first pixel and a second pixel. The first pixel corresponds to a first surface error associated with a first location on the surface and the second pixel corresponds to a second surface error associated with a second location on the surface.

In some implementations, the pixel map is generated (1504) in real-time using a surface height measurement sensor (e.g., using an optical interferometer, height sensor, or electromagnetic probe incorporated into the MFDP system). Alternatively, the pixel map is generated (1506) using a metrology tool (e.g., independent of the MFDP system) prior to the filling, positioning, and determining operations, which are described below (cf. operations 1508, 1510, and 1516). Still alternatively, in some implementations, the pixel map is generated using a metrology tool that is incorporated into the MFDP system (e.g., prior to the positioning operation 1510).

The method 1500 further includes filling (1508) the gas chamber with a discharging medium to a predefined pressure. For example, in some implementations, the discharging medium includes helium, or nitrogen, and/or mixture thereof and the predefined pressure is in a range of one atmosphere to tens of atmospheres.

The method 1500 further includes positioning (1510) an electrode with respect to the surface such that the electrode is proximal to the first location. In some implementations, the electrode is (1512) a respective electrode in an electrode array. The electrode array includes a plurality of electrodes. It should be understood that positioning the electrode with respect to the surface can be achieved in any number of ways, including: maintaining the electrode at a fixed position while moving the surface (e.g., the object having the surface), maintaining the surface at a fixed position while moving the electrode, or moving both the surface and electrode. In other words, positioning the electrode with respect to the surface should be construed to mean any type of mechanical movement that results in the stated relative position of the surface and the electrode.

In some implementations, the electrode is (1514) a needle-type electrode having a tip. The tip has a distal end disposed proximal to the surface and characterized by a radius of curvature at the distal end within a first predefined range, and an included angle within a second predefined range. The internal angle, denoted a, is given by the formula $\alpha = 2\pi - \beta$, where $\beta$ is the outer angle described with reference to FIGS. 1-1 and 1-2. In some implementations, the first predefined range is one of the group consisting of: 10 nm to 100 nm, 50 nm to 500 nm, and 100 nm to 2000 nm; and the second predefined range is one of the group consisting of: 15 degrees to 20 degrees, 5 degrees to 45 degrees, and 10 degrees to 30 degrees.

The method 1500 further includes determining (1516) if the first surface error meets predefined polishing criteria. In accordance with a determination that the first surface error meets (1518) the predefined polishing criteria, the method 1500 includes triggering an electrical breakdown of the discharging medium whereby the electrical breakdown results in a discharging pulse that polishes the surface.

In some implementations, triggering the electrical breakdown includes (1520) applying a voltage between the electrode and the surface. The voltage is greater than a breakdown voltage of the discharging medium. In some implementations, the application of the voltage between the electrode and the surface is gated (1522) so as to control a temporal duration of the discharging pulse. In some implementations, the application of the voltage between the electrode and the surface is gated using a gas-filled tube (e.g., a gas-filled tube used as a fast switch). Alternatively, a different type of switch with a fast response time is used instead of a gas-filled tube.

In some implementations, triggering the electrical breakdown includes applying (1524) a preionization signal to a region between the electrode and the surface. In some implementations, the preionization signal is provided (1526) by one of a laser (meaning one or more lasers) or an ultraviolet (UV) lamp. In some implementations, lamp or laser light (e.g., from the UV lamp or from the one or more lasers, respectively) is split into multiple beams and each beam passes through a transporting fiber and is focused by a micro-lens into the discharge cavity, near the tip of an electrode (e.g., a respective electrode in an electrode array).

In accordance with a determination that the first surface error does not meet the predefined polishing criteria (1528), the method 1500 further includes forgoing (1530) triggering of the electrical breakdown of the discharging medium and re-positioning (1532) the electrode with respect to the surface such that the electrode is proximal to the second location.

It should be understood that the particular order in which the operations in FIGS. 15-1 and 15-2 have been described is merely exemplary and is not intended to indicate that the described order is the only order in which the operations could be performed. One of ordinary skill in the art would recognize various ways to reorder the operations described herein.

Figures 1, 16:
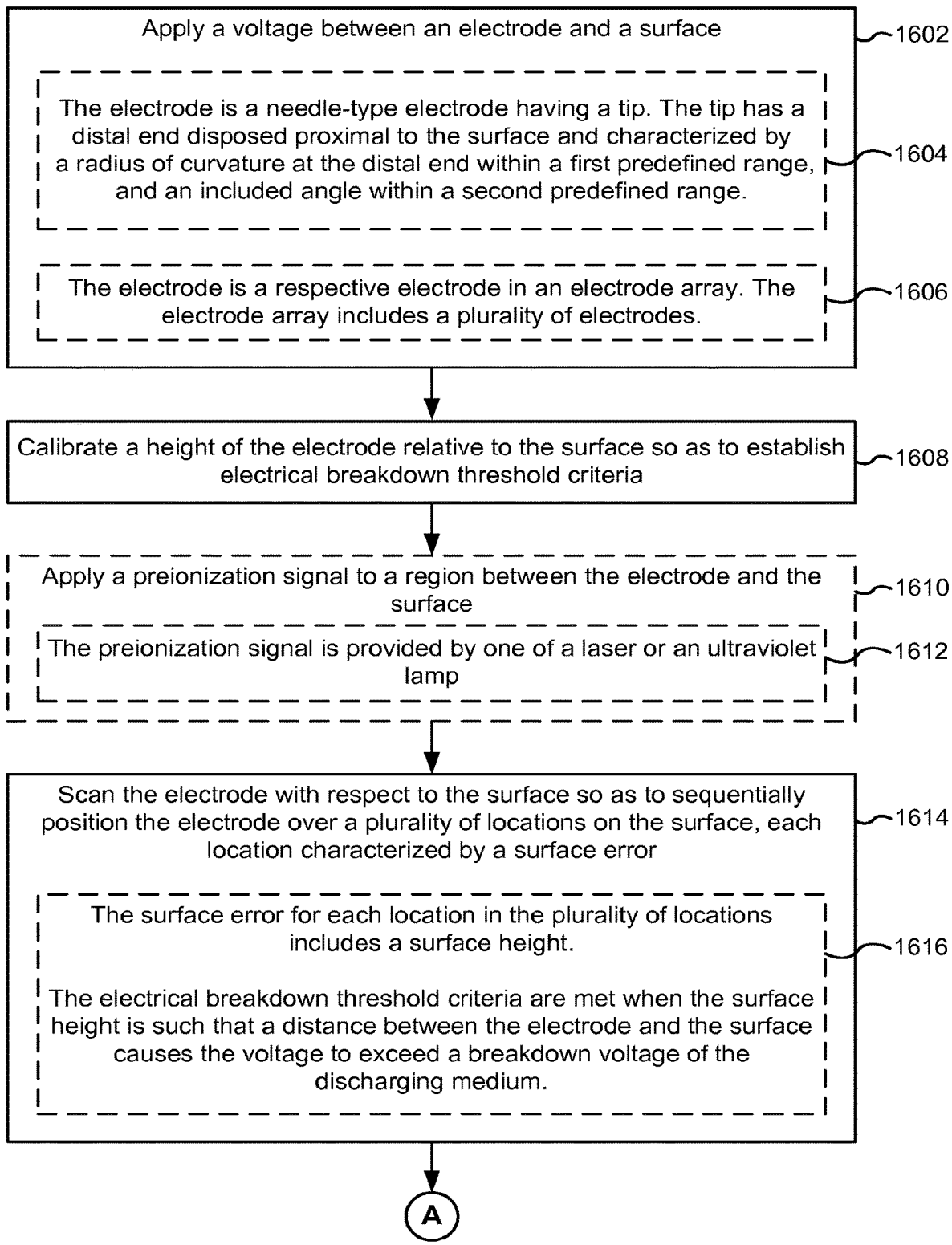
Figures 2, 16:
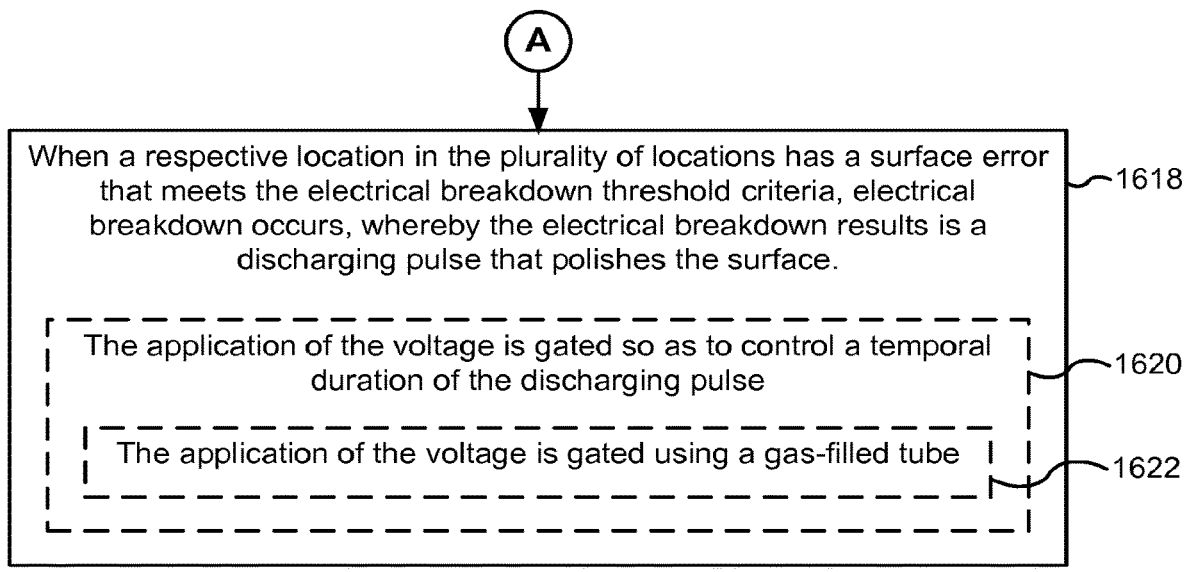

FIGS. 16-1 and 16-2 are flow diagrams illustrating a method 1600 of polishing a surface, in accordance with some implementations.

The method 1600 includes applying (1602) a voltage between an electrode and a surface. In some implementations, the electrode is (1604) a needle-type electrode having a tip. The tip has a distal end disposed proximal to the surface and characterized by a radius of curvature at the distal end within a first predefined range, and an included angle within a second predefined range. The internal angle, denoted $\alpha$, is given by the formula $\alpha = 2\pi - \beta$, where $\beta$ is the outer angle described with reference to FIGS. 1-1 and 1-2. In some implementations, the first predefined range is one of the group consisting of: 10 nm to 100 nm, 50 nm to 500 nm, and 100 nm to 2000 nm; and the second predefined range is one of the group consisting of: 15 degrees to 20 degrees, 5 degrees to 45 degrees, and 10 degrees to 30 degrees. In some implementations, the electrode is (1606) a respective electrode in an electrode array. The electrode array includes a plurality of electrodes.

The method 1600 further includes calibrating (1608) a height of the electrode relative to the surface so as to establish electrical breakdown threshold criteria. In some circumstances, the result of the calibration operation 1608 is that the electrode tip is positioned at a first height with respect to an average height of the surface. In such circumstances, the applied voltage at the first height in insufficient to cause electrical breakdown (e.g., the applied voltage is less than the breakdown voltage). However, the surface may include locations with a corresponding height such that the applied voltage is sufficient to cause electrical breakdown, thereby releasing a discharging pulse, as described below with reference to operation 1616.

In some implementations, the method 1600 includes applying (1610) a preionization signal to a region between the electrode and the surface (e.g., the discharge cavity). In some implementations, the preionization signal is provided (1526) by one of a laser (meaning one or more lasers) or an ultraviolet (UV) lamp. In some implementations, lamp or laser light (e.g., from a UV lamp or from one or more lasers, respectively) is split into multiple beams and each beam passes through a transporting fiber and is focused by a micro-lens into the discharge cavity, near the tip of an electrode (e.g., a respective electrode in an electrode array).

The method 1600 further includes scanning (1614) the electrode with respect to the surface so as to sequentially position the electrode over a plurality of locations on the surface, each location characterized by a surface error. It should be understood that scanning the electrode with respect to the surface can be achieved in any number of ways, including: maintaining the electrode at a fixed position while moving the surface (e.g., the object having the surface), maintaining the surface at a fixed position while moving the electrode, or moving both the surface and electrode. In other words, scanning the electrode with respect to the surface should be construed to mean any type of mechanical movement that results in a change in the relative position of the surface and the electrode.

In some circumstances, the surface error for each location in the plurality of locations includes (1616) a surface height. The electrical breakdown threshold criteria are then met when the surface height is such that a distance between the electrode and the surface causes the voltage to exceed a breakdown voltage of the discharging medium.

In any event, when a respective location in the plurality of locations has a surface error that meets the electrical breakdown threshold criteria, electrical breakdown occurs (1618), whereby the electrical breakdown results in a discharging pulse that polishes the surface. In some implementations, the application of the voltage is gated (1620) so as to control a temporal duration of the discharging pulse. The application of the voltage is gated using (1622) a gas-filled tube, or another type of switch with a fast response time.

It should be understood that the particular order in which the operations in FIGS. 16-1 and 16-2 have been described is merely exemplary and is not intended to indicate that the described order is the only order in which the operations could be performed. One of ordinary skill in the art would recognize various ways to reorder the operations described herein.

Figure 17:
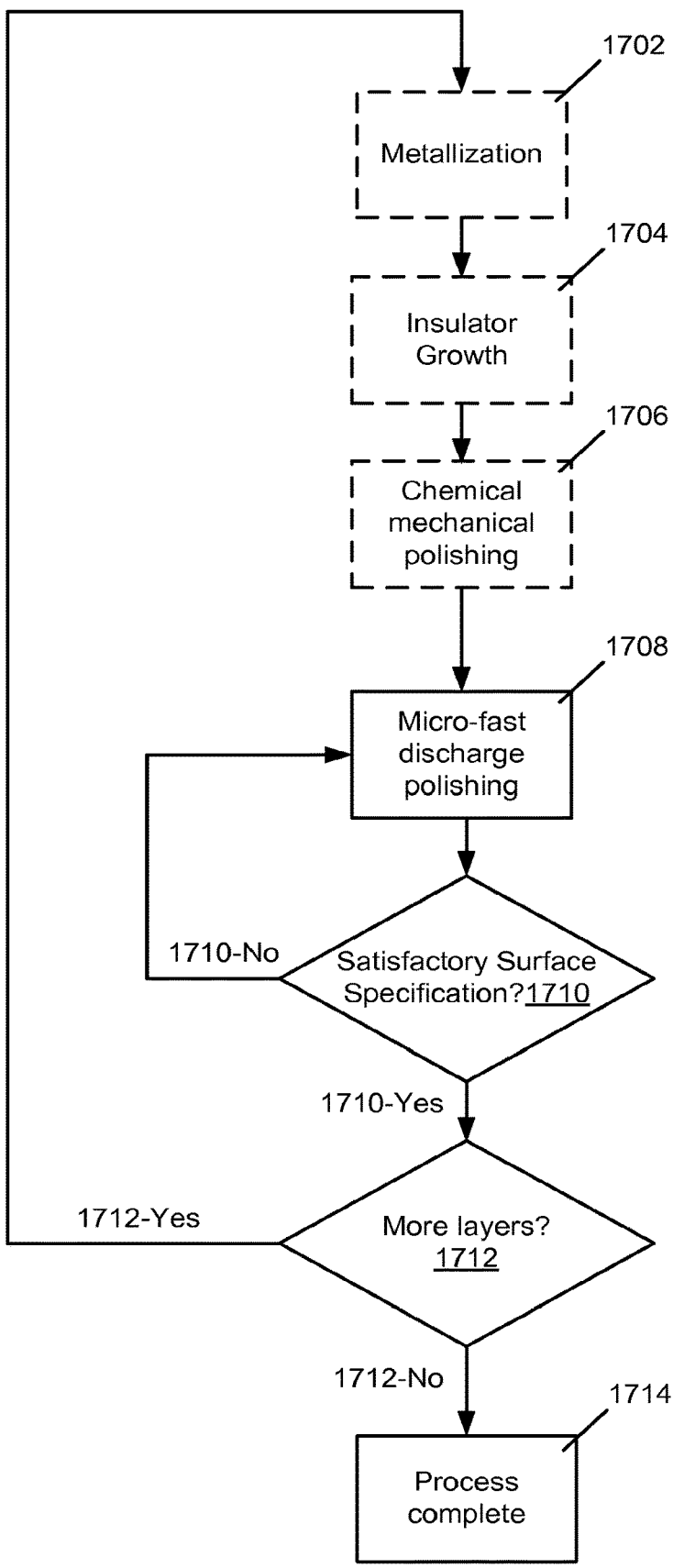
FIG. 17 is a process diagram illustrating a semiconductor process in which MFDP polishing is used, in accordance with some implementations.

FIG. 17 is a process diagram illustrating a semiconductor process 1700 in which MFDP polishing is used, in accordance with some implementations. In some implementations, semiconductor process 1700 is used in conjunction with other known processes to fabricate a semiconductor device on a chip.

Process 1700 optionally includes a metallization operation 1702 and an insulator growth operation 1704. Collectively, the metallization operation 1702 and the insulator growth operation 1704 serve to fabricate a respective layer of the semiconductor device. In some circumstances, the layer may include features such as a vias, contacts, interconnects, source and drain regions of field effect transistors, metallic structures, microelectromechanical system (MEMS) structures, and the like. In some implementations, known operations other than metallization and insulator growth may be substituted for one or both of operations 1702 and 1704, respectively. In some implementations, the process 1700 may include multiple insulator growth operations 1704, each of which operation includes, for example, patterning and etching.

After the layer is deposited, the process 1700 optionally includes chemical mechanical polishing operation 1706, which can be performed using conventional chemical mechanical polishing (CMP) methods known in the art.

To improve upon the result of CMP operation 1706, the chip is subsequently polished using an MFDP operation 1708. If the surface specification is not satisfactory (1710—No) following the MFDP operation 1708, another MFDP operation 1708 is performed. In some circumstances, subsequent MFDP operations 1708 are performed using the same MFDP system tuned to different parameters, while in some implementations, subsequent MFDP operations 1708 are each performed using a different MFDP system (e.g., as described with reference to FIG. 8).

If the surface specification is satisfactory (1710—Yes), and there are no more device layers to be fabricated (1712—No), then the process 1700 is complete (1714). On the other hand, if more layers are to be fabricated (1712—Yes), then the process 1700 begins again at metallization operation 1702.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles of the disclosure and its practical applications, to thereby enable others skilled in the art to best utilize the various implementations with various modifications as are suited to the particular use contemplated.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular implementations only and is not intended to be limiting of the claims. As used in the description of the implementations and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Throughout the preceding description, various implementations are described within the context of wafers, chips, reticles and the like. This is purely for convenience of explanation and is not intended to limit the claims that follow.

What is claimed is:

1. A method of polishing a surface of an object disposed within a gas chamber, comprising:
    generating a pixel map of the surface, wherein the pixel map includes a plurality of pixels including a first pixel and a second pixel, the first pixel corresponding to a first surface error associated with a first location on the surface and the second pixel corresponding to a second surface error associated with a second location on the surface;
    filling the gas chamber with a gaseous discharging medium to a predefined pressure;
    positioning an electrode within the gas chamber with respect to the surface such that the electrode is proximal to the first location, wherein a region between the electrode and the surface is filled with the gaseous discharging medium to the predefined pressure;
    determining if the first surface error corresponds to a height of the surface relative to a reference surface that exceeds a threshold value;
    in accordance with a determination that the first surface error corresponds to a height of the surface relative to the reference surface that exceeds the threshold value, triggering an electrical breakdown of the gaseous discharging medium between the electrode and the first location, whereby the electrical breakdown results in a discharging pulse that polishes the surface;
    in accordance with a determination that the first surface error does not corresponds to a height of the surface relative to the reference surface that exceeds the threshold value, forgoing triggering of the electrical breakdown of the gaseous discharging medium; and
    re-positioning the electrode with respect to the surface such that the electrode is proximal to the second location.

2. The method of claim 1, wherein triggering the electrical breakdown includes applying a voltage between the electrode and the surface, the voltage being greater than a breakdown voltage of the gaseous discharging medium.

3. The method of claim 2, wherein the application of the voltage between the electrode and the surface is gated so as to control a temporal duration of the discharging pulse.

4. The method of claim 3, wherein the application of the voltage between the electrode and the surface is gated using a gas-filled tube.

5. The method of claim 1, wherein triggering the electrical breakdown includes applying a pre-ionization signal to a region between the electrode and the surface.

6. The method of claim 5, wherein the pre-ionization signal is provided by one of a laser or an ultraviolet lamp.

7. The method of claim 1, wherein the electrode is a needle-type electrode having a tip, said tip having a distal end disposed proximal to the surface and characterized by:
    a radius of curvature at the distal end within a first predefined range; and
    an included angle within a second predefined range.

8. The method of claim 7, wherein:
    the first predefined range is one of the group consisting of: 10 nm to 100 nm, 50 nm to 500 nm, and 100 nm to 2000 nm; and the second predefined range is one of the group consisting of: 15 degrees to 20 degrees, 5 degrees to 45 degrees, and 10 degrees to 30 degrees.

9. The method of claim 1, wherein the pixel map is generated in real-time using a surface height measurement sensor.

10. The method of claim 1, wherein the pixel map is generated using a metrology tool prior to the filling, positioning, and determining operations.

11. The method of claim 1, wherein the electrode is a respective electrode in an electrode array, the electrode array includes a plurality of electrodes.

12. The method of claim 1, wherein the predefined pressure is above one atmosphere.

* * * * *

UNITED STATES PATENT AND TRADEMARK OFFICE
CERTIFICATE OF CORRECTION

| | | |
|---|---|---|
| PATENT NO. | : 10,546,791 B2 | Page 1 of 1 |
| APPLICATION NO. | : 15/449377 | |
| DATED | : January 28, 2020 | |
| INVENTOR(S) | : Hsia | |

It is certified that error appears in the above-identified patent and that said Letters Patent is hereby corrected as shown below:

In the Claims

Claim 1, Column 30, Line 35, please delete "not corresponds to" and insert --not correspond to--.

Signed and Sealed this
Fourteenth Day of April, 2020

Andrei Iancu
*Director of the United States Patent and Trademark Office*